United States Patent
Kawakita et al.

(10) Patent No.: US 10,043,598 B2
(45) Date of Patent: Aug. 7, 2018

(54) PROCESS FOR PRECIPITATION OF CONDUCTING POLYMER/METAL COMPOSITES, AND CONDUCTING POLYMER/METAL COMPOSITES

(75) Inventors: Jin Kawakita, Tsukuba (JP); Toyohiro Chikyo, Tsukuba (JP)

(73) Assignee: NATIONAL INSTITUTE FOR MATERIALS SCIENCE, Tsukuba-Shi, Ibaraki (JP)

( * ) Notice: Subject to any disclaimer, the term of this patent is extended or adjusted under 35 U.S.C. 154(b) by 584 days.

(21) Appl. No.: 14/236,142

(22) PCT Filed: Jul. 27, 2012

(86) PCT No.: PCT/JP2012/069236
§ 371 (c)(1),
(2), (4) Date: Jan. 30, 2014

(87) PCT Pub. No.: WO2013/018732
PCT Pub. Date: Feb. 7, 2013

(65) Prior Publication Data
US 2014/0162061 A1   Jun. 12, 2014

(30) Foreign Application Priority Data

Aug. 1, 2011 (JP) ................ 2011-168502
Jan. 4, 2012 (JP) ................ 2012-000197
Feb. 23, 2012 (JP) ................ 2012-036899

(51) Int. Cl.
*H01B 1/12* (2006.01)
*C08G 61/12* (2006.01)
(Continued)

(52) U.S. Cl.
CPC ........... *H01B 1/124* (2013.01); *C08G 61/124* (2013.01); *C08G 61/126* (2013.01);
(Continued)

(58) Field of Classification Search
CPC ................ C08G 61/124; C08G 61/126; C08G 73/0266; C08G 2261/3221;
(Continued)

(56) References Cited

U.S. PATENT DOCUMENTS

| | | |
|---|---|---|
| 5,855,755 A | 1/1999 | Murphy et al. |
| 6,334,965 B1 | 1/2002 | Singh et al. |

(Continued)

FOREIGN PATENT DOCUMENTS

| | | |
|---|---|---|
| JP | 2004-087427 A | 3/2004 |
| JP | 2004-359724 A | 12/2004 |

(Continued)

OTHER PUBLICATIONS

Pillalamarri et al., "One-Pot Synthesis of Polyaniline-Metal Nanocomposites", Chem. Mater. vol. 17, pp. 5941-5944 (2005).*

(Continued)

*Primary Examiner* — Scott R Walshon
(74) *Attorney, Agent, or Firm* — Manabu Kanesaka

(57) ABSTRACT

A process of producing a conducting material suitable for being filled in TSVs for LSI chip 3D package, etc. includes that a solution containing a monomer that provides a conducting polymer, anions, and metal ions such as $Ag^+$ or $Cu^{2+}$ is irradiated with ultraviolet radiation or light having the energy necessary for exciting electrons up to an energy level capable of reducing the metal ions to precipitate a conducting polymer/metal composite. This enables an electrical conductor of high electrical conductivity to be precipitated faster than could be achieved by conventional processes.

6 Claims, 20 Drawing Sheets

(51) Int. Cl.
C08G 73/02 (2006.01)
H01L 51/00 (2006.01)
H05K 1/09 (2006.01)
H05K 3/10 (2006.01)
C08K 3/08 (2006.01)
H01L 51/42 (2006.01)

(52) U.S. Cl.
CPC ............ *C08G 73/0266* (2013.01); *C08K 3/08* (2013.01); *H01B 1/127* (2013.01); *H01B 1/128* (2013.01); *H01L 51/0027* (2013.01); *H05K 1/092* (2013.01); *H05K 3/106* (2013.01); *C08G 2261/3221* (2013.01); *C08G 2261/3223* (2013.01); *C08K 2003/0806* (2013.01); *C08K 2201/011* (2013.01); *H01L 51/0036* (2013.01); *H01L 51/0091* (2013.01); *H01L 51/4213* (2013.01); *H05K 2201/0329* (2013.01); *H05K 2201/10143* (2013.01); *H05K 2203/1157* (2013.01); *Y10T 428/2927* (2015.01); *Y10T 428/2958* (2015.01)

(58) Field of Classification Search
CPC ........................ C08G 2261/3223; H01B 1/124; H01B 1/127; H01B 1/128; H01L 51/0091; H01L 51/0036; H01L 51/4213; Y10T 428/2927
See application file for complete search history.

(56) References Cited

U.S. PATENT DOCUMENTS

| | | | | |
|---|---|---|---|---|
| 8,038,907 B2 * | 10/2011 | Epstein | ................. | B82Y 30/00 252/500 |
| 2011/0151255 A1 * | 6/2011 | Kim, II | ................. | B82Y 30/00 428/372 |

FOREIGN PATENT DOCUMENTS

| | | | | |
|---|---|---|---|---|
| JP | | 3743801 B2 | 12/2005 | |
| JP | | 2010-095688 A | 4/2010 | |
| JP | | 2010-225697 A | 10/2010 | |
| JP | | 2012-052043 A | 3/2012 | |
| WO | | 97/39383 A1 | 10/1997 | |
| WO | WO 2008100163 A1 * | | 8/2008 | ................ B22F 9/24 |

OTHER PUBLICATIONS

Li et al., "Structure-Dependent Electrical Properties of Carbon Nanotube Fibers", Advanced Materials vol. 19, pp. 3358-3363 (2007).*

Slocik, et al., "Biotemplated Metal Nanowires using Hyperthermophilic Protein Filaments", Small vol. 5, No. 18 pp. 2038-2042 (2009).*

He et al., "Fabrication of Gold Nanocrystal-Coated Polypyrrole Nanotubles", J. Mater. Chem. vol. 15, pp. 859-862 (2005).*

Shirale et al., "Effect of Aspect Ratio (Length:Diameter) on a Single Polypyrrole Nanowire FET Device", J. Phys. Chem. C vol. 114, pp. 13375-13380 (Jul. 2010).*

Europe Patent Office, "Search Report for EP 12820585.3," dated Jan. 5, 2015.

Khanna, P. K. et al., "Synthesis of Ag/polyaniline nanocomposite via an in situ photo-redox mechanism," Materials Chemistry and Physics, 2005, p. 214-219, vol. 92, No. 1, Elsevier.

De Barros, R.A. et al., "Conducting polymer photopolymerization mechanism: The role of nitrate ions ($NO_3^{<->}$)," Synthetic Metals, 2010, p. 61-64, vol. 160, No. 1-2, Elsevier.

Stejskal, J. et al., "The reduction of silver ions with polyaniline: The effect of the type of polyaniline and the mole ratio of the reagents," Materials Letters, 2009, p. 709-711, vol. 63, No. 8, Elsevier.

De Barros, R. A., et al., "Polyaniline/silver nanocomposite preparation under extreme or non-classical conditions," Synthetic Metals, 2008, p. 922-926, vol. 158, No. 21-24, Elsevier.

Breimer, M. A. et al., "Incorporation of Metal Nanoparticles in Photopolymerized Organic Conducting Polymers: A Mechanistic Insight," Nano Letters, 2001, p. 305-308, vol. 1, No. 6, American Chemical Society.

Li, B. T. et al., "Coordinated organogel templated fabrication of silver/polypyrrole composite nanowires," Chinese Chemical Letters, 2011, p. 123-126, vol. 22, No. 1, Elsevier.

Japan Patent Office, "International Search Report for PCT/JP2012/069236," dated Jul. 27, 2012.

T. Yoshinaga et al., "Trends in R&D in TSV Technology for 3D LSI Packaging," Science & Technology Trends, Apr. 2010, p. 23-34, Japan.

S. Hashimoto et al., "Electroless Copper for Semi-Additive Process in Build-up Application," p. 1-6, Technical Development Department, Central Research Laboratory, C. Uyemura & Co., Ltd., Osaka, Japan.

B. Kim et al., "Step Coverage Simulation for Non-liner Surface Reaction," Jun. 19, 1998, p. 15-19, vol. 12, Kyushu University Institute of Materials, Chemistry and Engineering, Japan.

S. Fujii et al. "One-step synthesis of polypyrrole-coated silver nanocomposite particles and their application as a coloured particulate emulsifier," Journal of Materials Chemistry, Aug. 24, 2007, p. 3777-3779, The Royal Society of Chemistry.

Y. J. Jung et al., "Morphology and conducting property of Ag/poly(pyrrole) composite nanoparticles: Effect of polymeric stabilizers," Synthetic Metals, Aug. 2, 2011, p. 1991-1995, vol. 161, Elsevier B.V.

"Resistivity Meter Series Line up Catalogue," Mitsubishi Chemical Group, p. 1-14, Mitsubishi Chemical Analytech Co., Ltd., Instuments Division, Chigasaki-shi, Kanagawa, Japan.

* cited by examiner

FIG. 6
Substrate: ABS resin
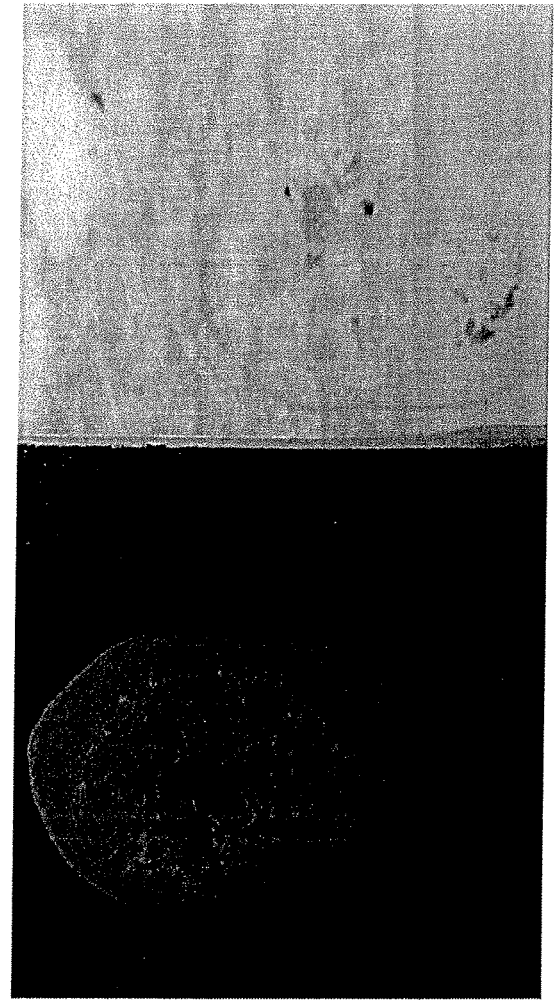
(a) Before peeling
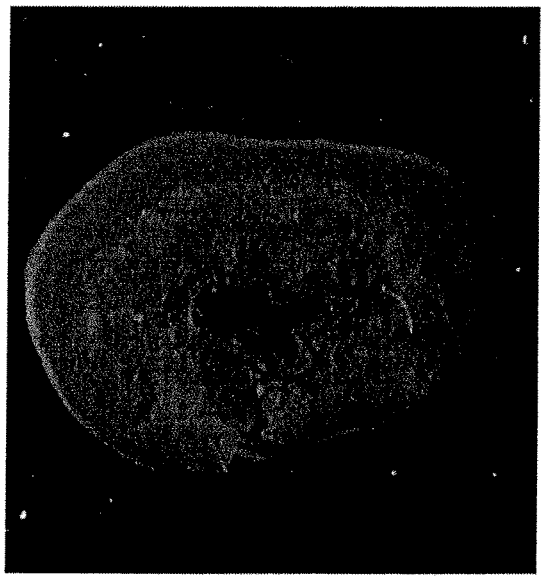
(b) After peeling Substrate: Polyvinyl chloride (PVC)

Substrate: Olefin resin

FIG. 11
Substrate: Polycarbonate (PC)
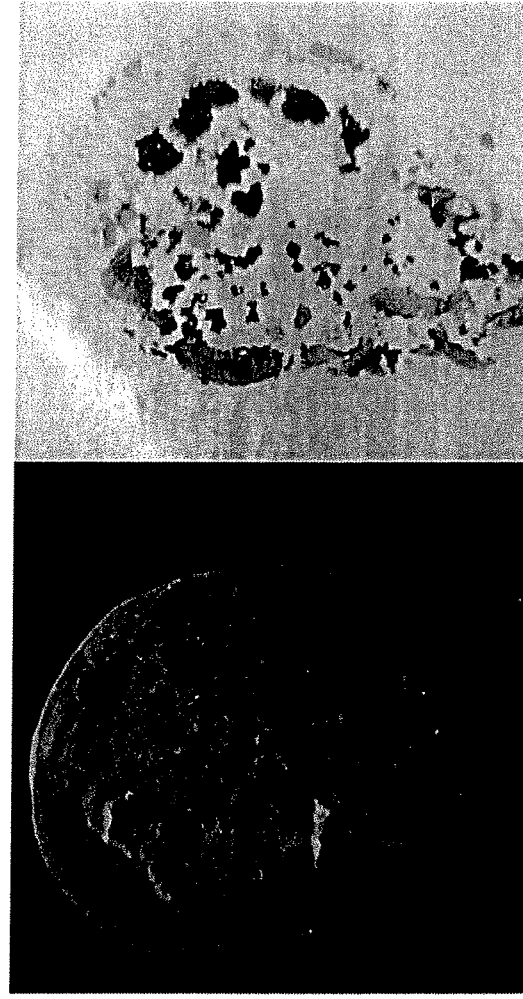
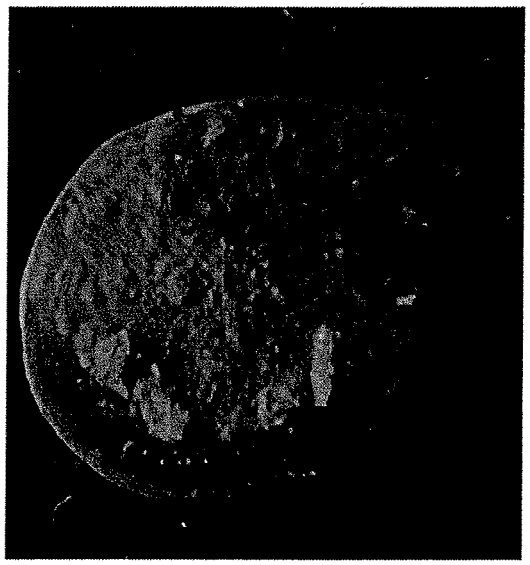
(a) Before peeling
(b) After peeling Substrate: Acrylic resin FIG. 14
Substrate: Silicone rubber
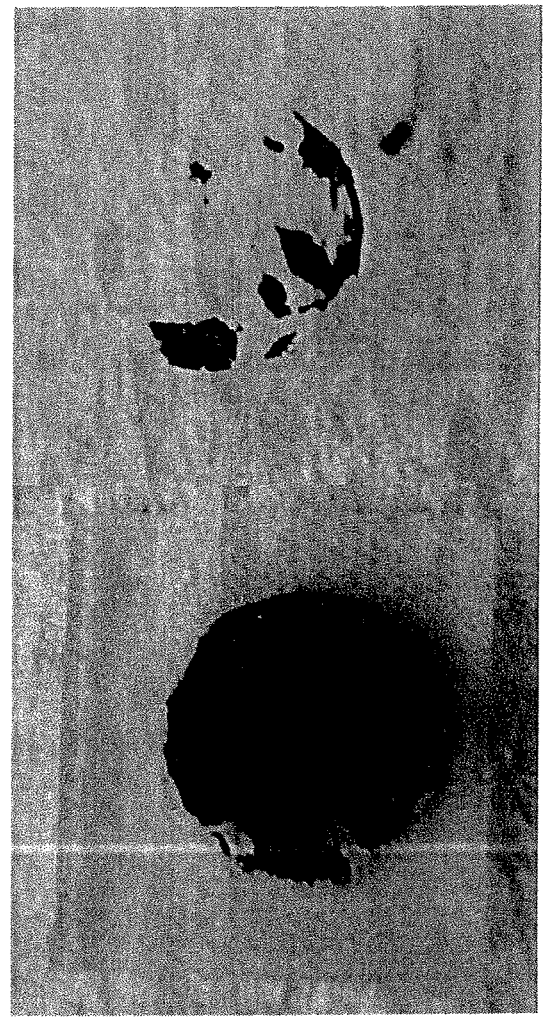
(b) After peeling
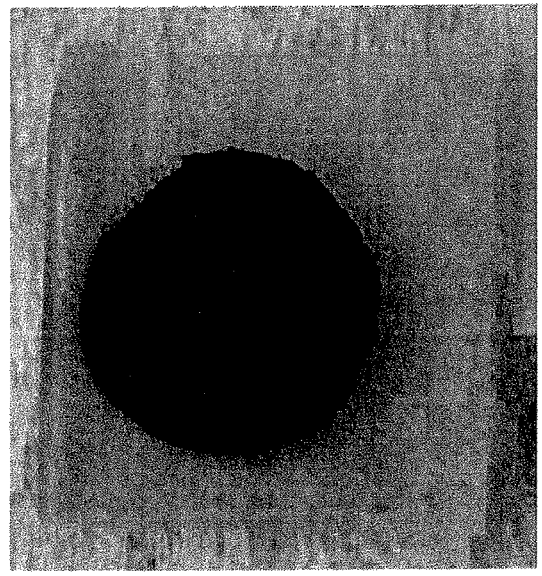
(a) Before peeling FIG. 15
Substrate: Normal paper
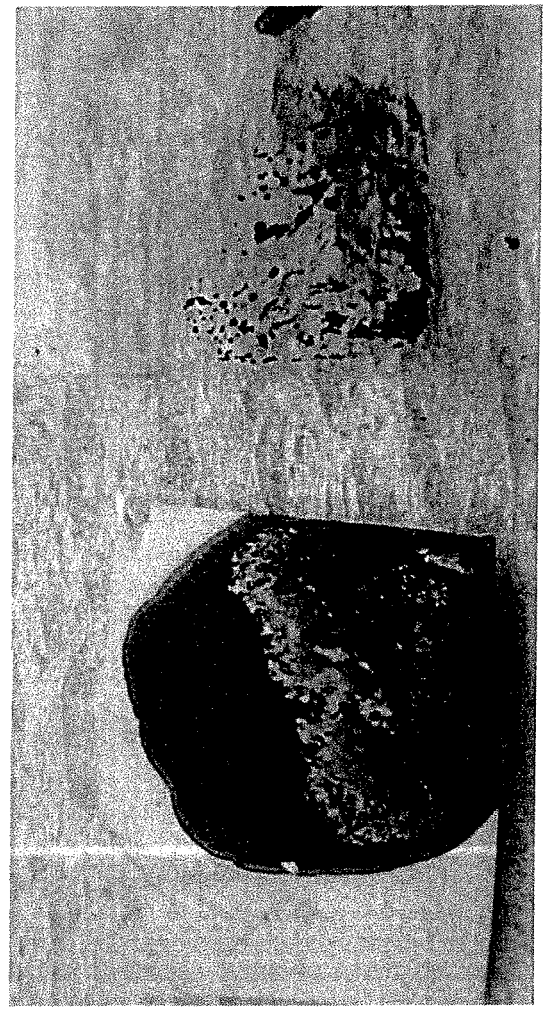
(a) Before peeling
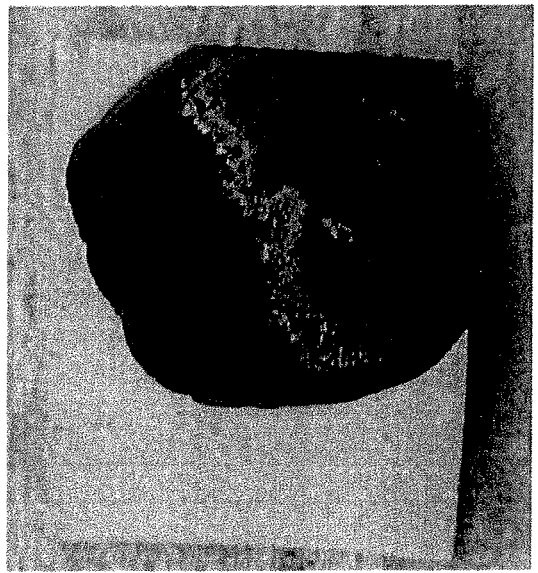
(b) After peeling Substrate: Glass (blasted on the surface)

Substrate: Glass (untreated on the surface)

Observation in section of the conducting material on the Teflon substrate through the embedding process FIG. 22
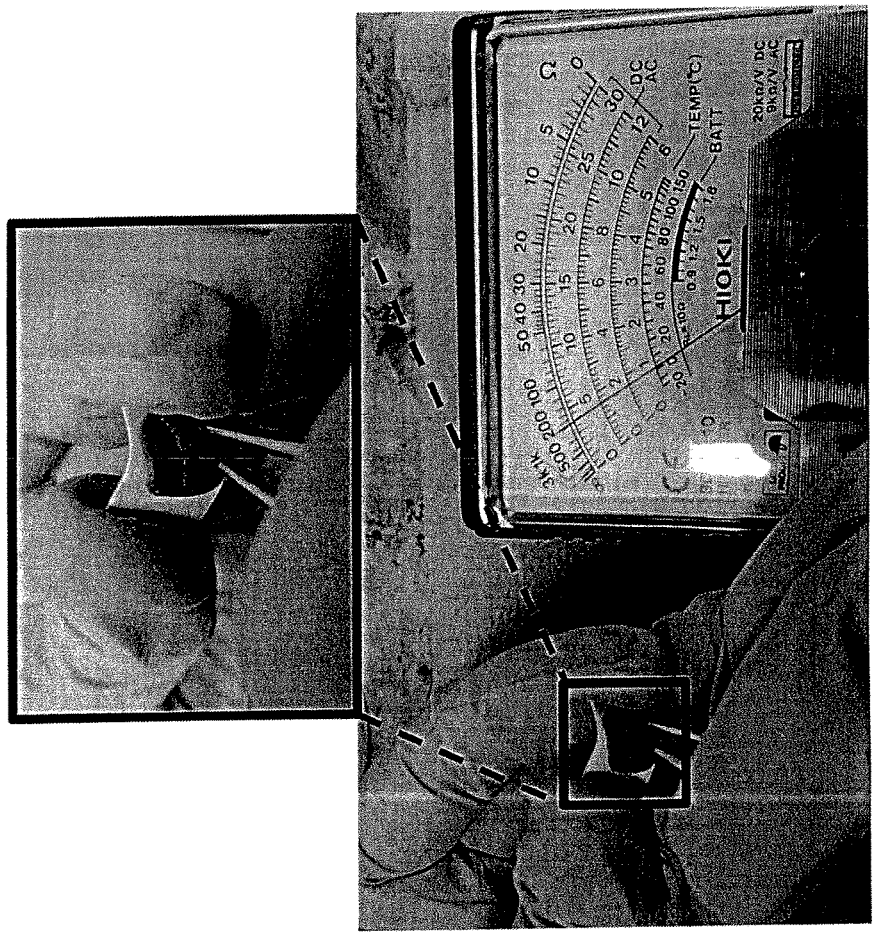
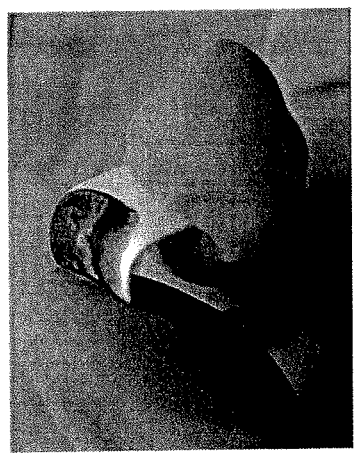

PROCESS FOR PRECIPITATION OF CONDUCTING POLYMER/METAL COMPOSITES, AND CONDUCTING POLYMER/METAL COMPOSITES

RELATED APPLICATIONS

The present application is National Phase of International Application No. PCT/JP2012/069236 filed Jul. 27, 2012, and claims priorities from Japanese Application No. 2011-168502 filed Aug. 1, 2011, Japanese Application No. 2012-000197 filed Jan. 4, 2012, and Japanese Application No. 2012-036899 filed Feb. 23, 2012.

TECHNICAL ART

The present invention relates to a process for precipitation of a conducting polymer/metal composite by co-precipitation of a conducting polymer and a metal, and more particularly to a process capable of obtaining the above-mentioned composite having high electrical conductivity within a short period of time. The present invention also relates to a conducting polymer/metal composite prepared by such a precipitation process.

BACKGROUND ART

Now that the limits of microprocessing of devices in LSI production processes are being reached, attention is directed to 3D package technique as one of methods for achieving much tighter integration. In the 3D package technique, LSI chips are longitudinally stacked up thereby increasing the number of devices per unit area. What is important for reducing this 3D package technique down to practice is electrical package technique of how to connect electrical signals between the stacked-up LSI chips. Electrical connections between LSI chips proposed and achieved so far in the art have relied upon a wire bonding process of making connections using metal narrow wires.

Wire bonding has been used in two-dimensional package over the long term, and its application to the 3D package technique would be relatively ready because of years of accumulation of more technical knowledge. To provide electrical connections of signals between the LSI chips by the wire bonding process, however, signals must first be led up to the peripheries of LSI chips, whence they are then connected up to the peripheries of the destination LSI chips using metal narrow wires, and then led down to sites lying in the LSI chips and in need of said signals using wires in the LSI chips. In the wire bonding process, therefore, there is the need for taking hold of wire bonding areas around the LSI chips, leading to a problem that the package area increases with an increase in signal transmission paths between the LSI chips. Further, the number of signal paths between the LSI chips is restricted by the number of bonding terminals located around the LSI chips.

In recent years, attention has been attracted to through silicon via (TSV) technique as another means for making electrical connections between LSI chips (see Non-Patent Publication 1). In the TSV technique, circuits between the LSI chips are directly connected together using TSVs that are longitudinal wires extending through the stacked-up LSI chips, instead of electrically connecting signals by way of wire bonding outside the LSI chips. By wiring LSI chips together using TSVs, the problems mentioned in conjunction with the wire bonding technique are expected to be overcome.

One of important challenges for practical applications of the TSV technique is to embed a conducting material within narrow pores (vias) having a high aspect ratio within a shorter period of time. Although use of copper as a high-conductivity embedding material for the TSV technique is now under study (see Non-Patent Publication 2), yet it takes a 2 hour or longer time to achieve this by copper plating, so there is still the need for shortening that time significantly. As the embedding material, poly-silicon, tungsten, silver or the like in addition to copper are now under investigation (see Patent Publication 1 and Non-Patent Publication 3). Comparisons of these embedding materials are tabulated in Table 1.

TABLE 1

|  | Poly-silicon | W | Cu | Ag |
|---|---|---|---|---|
| Conductivity ($\Omega^{-1}$ cm$^{-1}$) | $4.0 \times 10^4$ | $1.89 \times 10^5$ | $5.96 \times 10^5$ | $6.3 \times 10^5$ |
| Wiring Preparation | CVD | CVD | Plating | Vacuum Printing |
| Pretreatment (Formation of the barrier film) | SiN | WN (CVD) | Si/SiN Ti/TiN Ta/TaN (Sputtering Or CVD) | Unnecessary |
| Pretreatment (Formation of the seed layer) | Unnecessary | W (CVD) | Cu (CVD) | Unnecessary |
| Remarks |  | 1* | 2* | 3* |

1*: W is a strategic substance arising concern about stable availability.
2*: There is a problem with yields, and pores are likely to occur.
3*: Some post-thermal treatments are needed, and there is migration occurring.

Besides, conducting polymers are also being studied as the embedding material. Conducting polymers are resourceful materials that are less costly because of the capability of being used in normal temperature/pressure processes such as coating. However, they have a demerit of having a low conductivity.

By the way, there is a report about a method for co-precipitation of silver and polypyrrole that is a sort of conducting polymer through the following reaction mechanism with a view to applying them to catalyst carriers, marker particles for immunodiagnosis, etc. (Non-Patent Publications 4 and 5).

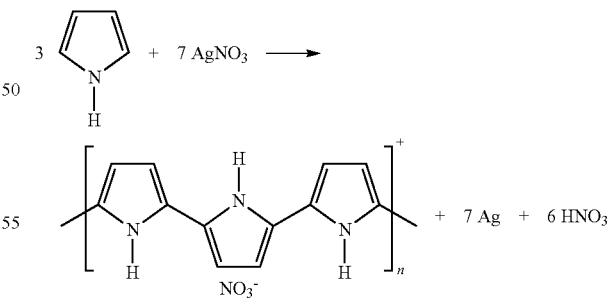

According to this method, there is a possibility that a material higher in conductivity than the conducting polymers may be filled in vias in simple operations.

However, the material obtained by this method, too, cannot achieve the conductivity high enough to satisfy the requirement for a filler for TSVs, and there is still a problem with production cost, because relatively base metals such as copper cannot be used.

Patent Publications 2 and 3 disclose another process for producing conducting polymer/metal composites, but they fail to give any suggestion of precipitation of composites with the aid of light irradiation or the like.

LISTING OF THE PRIOR ARTS

Patent Publications

Patent Publication 1: JP(A) 2010-225697
Patent Publication 2: U.S. Pat. No. 3,743,801
Patent Publication 3: JP(A) 2004-87427

Non-Patent Publications

Non-Patent Publication 1: Koji Yoshinaga et al., "Research & Development Trends of TSV Technology for 3D LSI Package", Science & Technology Trends April 2010, pp. 23-34
Non-Patent Publication 2: Shigeo Hashimoto et al., "Electroless Copper Plating Baths Suitable for Buildup Methods", Fine Plating, No. 55, Pages 51-58 (September 1999)
Non-Patent Publication 3: Kim Heikun et al., "Coverage Simulations for Diameters Exhibiting Nonlinear Surface Reactions", Functional Substance Science Research Center of Kyushu University, Vol. 12, No. 1 (1998), Pages 15-19
Non-Patent Publication 4: S. Fujii et al., J. Mater. Chem., 178 (2007) 3777.
Non-Patent Publication 5: Yeon Jae Jung et al., Synth. Met., 161 (2011) 1991.
Non-Patent Publication 6: "Lineup Catalog for Mitsubishi Chemical's Resistivity Meter Series" http://www.dins.jp/dins_j/6data/pdf/catalog/Lineup_catalog_J0408-LP.3000US.pdf

SUMMARY OF THE INVENTION

Objects of the Invention

The objects of the present invention are to provide a solution to the above-mentioned problems with the prior arts thereby providing a process capable of precipitating, within a short period of time, a conducting polymer/metal composite of high electrical conductivity that may be used as a filler for TSVs, and provide such a conducting polymer/metal composite.

Means for Achieving the Objects

According to one aspect of the invention, there is a process for precipitation of a conducting polymer/metal composite provided, in which a solution containing a monomer that is a raw material for the conducting polymer, an anion, and a metal ion is irradiated with light having energy necessary for exciting electrons up to a level capable of reducing said metal ion.

To provide the aforesaid energy, heat or sound may be used in combination with light.

The aforesaid monomer may be a monomer that provides an organic polymer based on a straight-chain compound, an aromatic compound, a heterocyclic compound or a heteroatom compound, all having a conjugate structure.

The aforesaid monomer may be selected from the group consisting of pyrrole, 3,4-ethylenedioxythiophene, and aniline.

The solvent for the aforesaid solution may be selected from the group consisting of acetonitrile, ethanol, and water.

The aforesaid metal ion may be an ion of at least one metal selected from the group consisting of gold, platinum, palladium, ruthenium, iridium, silver, copper, nickel, iron, chromium, zinc, cadmium, tellurium, tin, and lead.

Pyrrole may be used as the aforesaid monomer at a concentration of 0.1 mol/L or higher in the aforesaid solution, and $Ag^+$ may be used as the aforesaid metal ion at a concentration in the aforesaid solution that is five times up to 20 times as high as the concentration of the aforesaid pyrrole.

Alternatively, pyrrole may be used as the aforesaid monomer at a concentration of 0.05 mol/L or higher in the aforesaid solution, and $Cu^{2+}$ may be used as the aforesaid metal ion at a concentration in the aforesaid solution that is equal to or up to 10 times as high as the concentration of the aforesaid pyrrole.

According to another aspect of the invention, there is a conducting polymer/metal composite provided, which is precipitated by any one of the aforesaid processes.

According to yet another aspect of the invention, there is a conducting polymer/metal composite provided, which comprises a filament containing an organic conducting polymer and a metal nanoparticle, and in which at least a part of said metal nanoparticle is exposed on the surface of the organic conducting polymer that is the aforesaid filament.

The aforesaid filament may have a diameter of 1 μm or less.

The aforesaid filament may have a diameter of 0.1 μm or more.

The aforesaid filament may have an aspect ratio of 2 to 10.

The aforesaid metal nanoparticle may have a diameter of 10 to 200 nm.

According to the invention, a composite of a conducting polymer and a metal can be precipitated at high speeds in simple operation, and even a relatively base metal such as copper can be used, proffering benefits in terms of production cost reductions and saving of rare resources. The invention also ensures that the conducting polymer/metal composite has higher electrical conductivity because it is highly likely to be formed while the metal nanoparticle is exposed on the surface of the polymer.

BRIEF EXPLANATION OF THE DRAWING

FIG. 6 is a photograph indicative of the results of tape peel testing on an ABS resin substrate with the conducting polymer/metal composite precipitated on it.

FIG. 11 is a photograph indicative of the results of tape peel testing on a polycarbonate substrate with the conducting polymer/metal composite precipitated on it.

FIG. 14 is a photograph indicative of the results of tape peel testing on a silicone rubber substrate with the conducting polymer/metal composite precipitated on it.

FIG. 15 is a photograph indicative of the results of tape peel testing on a normal paper substrate with the conducting polymer/metal composite precipitated on it.

FIG. 22 is a photograph indicative of the results of bending testing on a substrate having a conducting polymer/metal composite.

EMBODIMENTS FOR CARRYING OUT THE INVENTION

In the invention, the composite of a metal and a conducting polymer is precipitated at high speeds with the aid of photoassist. Specifically, a substrate (such as silicon, germanium, III-V group semiconductors, oxide semiconductors, and glass sheets) is placed in a solution (such as acetonitrile, ethanol, and water) containing a monomer (such as pyrrole) that is a raw material for the conducting organic polymer and metal ions, and that solution is then irradiated with light having energy necessary for exciting electrons up to an energy level capable of reducing the metal ions. This light irradiation accelerates, or photoassists, a chemical reaction process in which the oxidative polymerization of the conducting polymer from the organic monomer and doping anions and the reductive precipitation of the metal from metal cations proceed at the same time. In the examples given later, such irradiation was carried out with ultraviolet light (having a wavelength of 400 nm or less), but light having a longer wavelength may be used although depending on the necessary excitation energy too. It would be obvious to those skilled in the art that light can be used in combination with heat or sound provided that they provide a stimulus good enough to offer equivalent excitation with respect to electrons. After the lapse of a given time, the substrate is taken out of the solution together with the precipitates on it, and dried.

As described above, the fast co-precipitation of the metal and conducting polymer is herein assisted by irradiation with light and so on, and this novel precipitation process offers some advantages over the prior art set forth in Non-Patent Publication 4 in that the conducting polymer can be formed at high speeds, and relatively "base" metals can be used.

Figure 1:
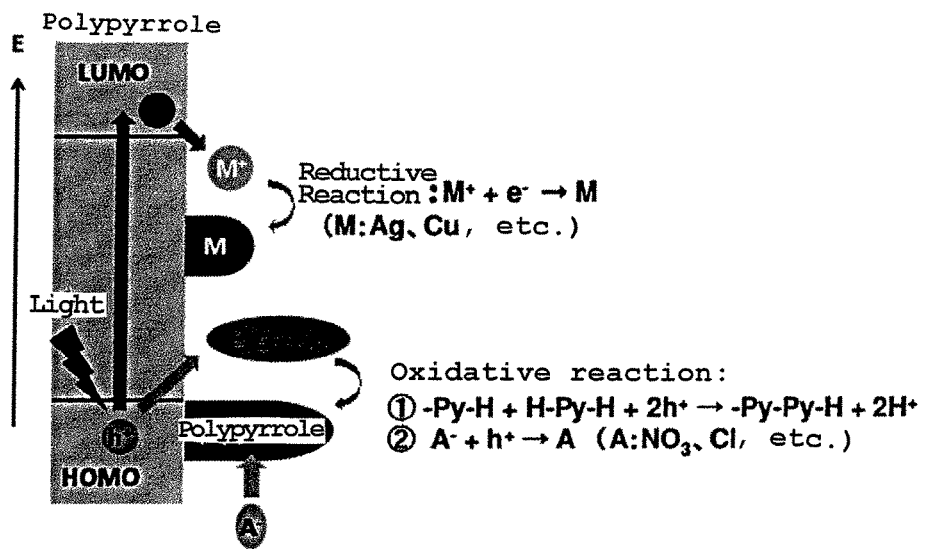
FIG. 1 is illustrative of the reaction mechanism according to the invention.

Although the reaction mechanism of the invention has not been entirely clarified as yet, the inventor's study indicates that there would be an unheard phenomenon involved in which holes and electrons are generated, assisting in the progress of strong oxidative reaction and reductive reaction, as can be seen from FIG. 1 in which polypyrrole is taken as an example of the conducting polymer. Specifically, the oxidative reaction and reductive reaction are promoted by holes and electrons. In the oxidative reaction by holes, the oxidative polymerization of pyrrole and the doping of anions take place, and in the reductive reaction by electrons, the precipitation of the metal occurs.

Figure 2:
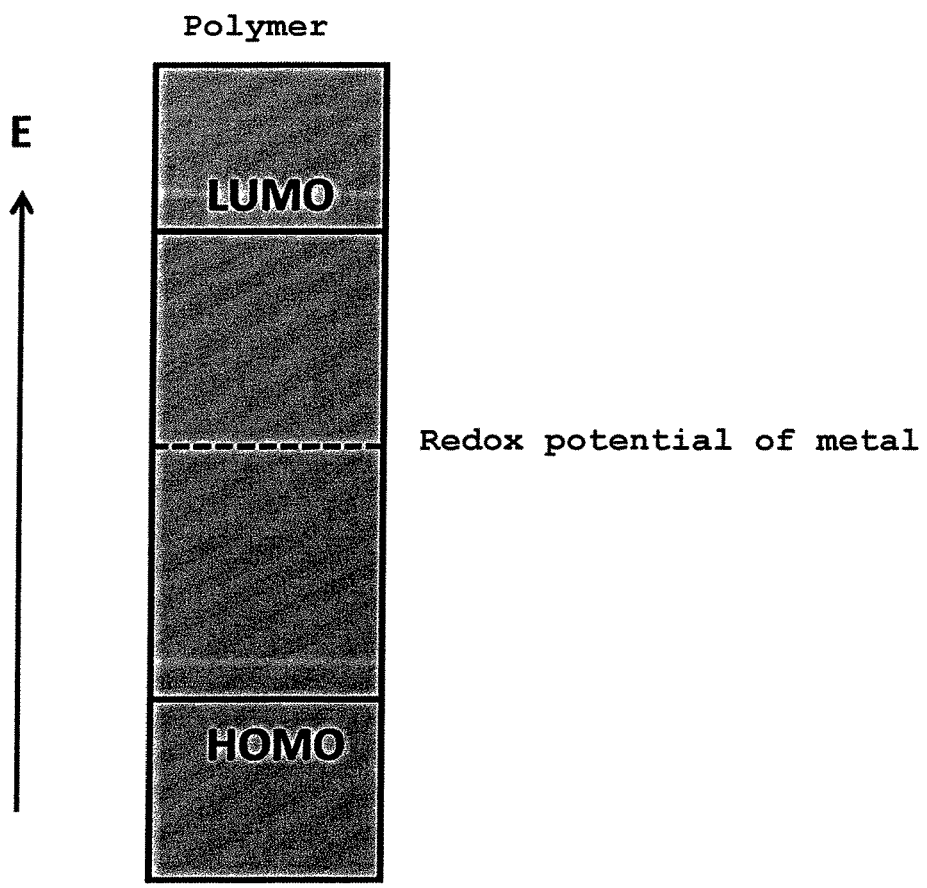
FIG. 2 is illustrative of the conditions under which the conducting polymer/metal composite can be precipitated.

The reaction mechanism as explained above teaches that when the redox potential of the metal lies in an energy position lower than a high energy level (for instance LUMO) where the electrons in the polymer are excited and can reach as shown in FIG. 2, a composite material of the polymer and metal can be precipitated.

From the above explanation of the reaction mechanism and the following examples, it is found that the following monomers and metals may be used as the raw material according to the invention.

Monomer: monomers from which organic polymers based on straight-chain compounds, aromatic compounds, heterocyclic compounds, and heteroatom compounds, all having a conjugate structure, may be obtained.

Metals: gold, platinum, palladium, ruthenium, iridium, silver, copper, nickel, iron, chromium, zinc, cadmium, tellurium, tin, and lead as well as alloys thereof.

The present invention, because of using an organic material as a main component, may have possible applications essentially to conducting wiring patterns on flexible substrates, conducting adhesives or the like. To this end, adhesion to a variety of substrates inclusive of plastic ones is one of important properties. Also in terms of applications to such 3D wiring as referred to in the "BACKGROUND ART", adhesion to the substrate is of importance. For this reason, adhesion testing (tape peel testing) and bending testing were carried out to glean data.

The present invention enables the conducting polymer/metal composite having high conductivity to be closely filled inside TSVs so that reliable, closely packaged electrical connections can be installed between LSI chips. The present invention also enables the conducting polymer/metal composite to be precipitated not only inside vias but also on diverse surfaces, and the thus precipitated composite can have flexibility so that flexible electrodes can be formed for diverse applications to, for instance, solar batteries and EL lighting.

EXAMPLES

Example 1

Conducting polymer/metal composites were precipitated by ultraviolet light irradiation using pyrrole, 3,4-ethylenedioxythiophene (EDOT), and aniline as the monomer from which the conducting polymers were obtained, $Cu^{2+}$, and $Ag^+$ as the metal ions, and chloride ions ($Cl^-$) for $Cu^{2+}$ and nitrate ions ($NO_3^-$) for $Ag^+$ as the anions. Thirty (30) experimental runs were conducted using varying types and concentrations of the monomer and varying types and concentrations of the metal ions. As a matter of course, it is to be noted that these examples are given by way of example only, and do not impose any limitation on the technical scope of the invention defined in the claims. Set out below are the experimental conditions and measuring conditions used herein.

Specific Experimental Conditions

Temperature: room temperature

Solvent: acetonitrile, ethanol, and water

Substrate: glass

Intensity of ultraviolet light: 50 mW/cm$^2$

Wavelength: 436 nm·405 nm·365 nm (emission lines)

Precipitation time: 0.4 to 240 min.

Method for Measuring Resistance Values

The resistance values were measured by a four-probe method using Loresta AP MCP-T4000 available from Mitsubishi Chemical Corporation. The measurement principles are not explained any longer for the reason of being well known, but if necessary, see Non-Patent Publication 6.

The conducting polymer/metal composites indicated by Run Nos. 1-30 in Table 2 were prepared by a process in which the sample (conducting polymer/metal composite) was settled (precipitated) down on the substrate placed on the bottom of the vessel.

The results of experimentation carried out in this way are set out in Table 2.

TABLE 2

| Run No. | Monomer Type | Monomer mol/L | $Ag^+$ mol/L | $Cu^{2+}$ mol/L | Resistance Value Ω |
|---|---|---|---|---|---|
| 1 | pyrrole | 0.5 | 5 | | OL |
| 2 | pyrrole | 0.2 | 2 | | 14.14 |
| 3 | pyrrole | 0.2 | 1 | | 0.00067 |
| 4 | pyrrole | 0.1 | 2 | | 8.54 |
| 5 | pyrrole | 0.1 | 1 | | 4.4 |
| 6 | pyrrole | 0.1 | 0.5 | | 32000 |
| 7 | pyrrole | 0.1 | 0.2 | | 35800 |
| 8 | pyrrole | 0.1 | 0.1 | | 68000 |
| 9 | pyrrole | 0.05 | 0.5 | | 4280000 |
| 10 | aniline | 0.2 | 2 | | 188 |
| 11 | aniline | 0.2 | 1 | | 220 |
| 12 | aniline | 0.1 | 1 | | 0.649 |
| 13 | aniline | 0.05 | 0.5 | | 21 |
| 14 | EDOT | 0.1 | 1 | | 2080000 |
| 15 | EDOT | 0.05 | 0.5 | | OL |
| 16 | pyrrole | 0.2 | | 2 | 13.35 |
| 17 | pyrrole | 0.2 | | 1 | 1394 |
| 18 | pyrrole | 0.1 | | 1 | 5.96 |
| 19 | pyrrole | 0.1 | | 0.5 | 559 |
| 20 | pyrrole | 0.1 | | 0.2 | 16100 |
| 21 | pyrrole | 0.1 | | 0.1 | 913 |
| 22 | pyrrole | 0.05 | | 0.5 | 38.9 |
| 23 | pyrrole | 0.05 | | 0.1 | 100.7 |
| 24 | pyrrole | 0.05 | | 0.05 | 273 |
| 25 | aniline | 0.2 | | 2 | 49000 |
| 26 | aniline | 0.2 | | 1 | OL |
| 27 | aniline | 0.1 | | 1 | OL |
| 28 | aniline | 0.05 | | 0.5 | OL |

TABLE 2-continued

| Run No. | Monomer Type | Monomer mol/L | $Ag^+$ mol/L | $Cu^{2+}$ mol/L | Resistance Value Ω |
|---|---|---|---|---|---|
| 29 | EDOT | 0.1 | | 1 | 689 |
| 30 | EDOT | 0.05 | | 0.5 | OL |

Note here that the metal ions ($Ag^+$ ions, $Cu^{2+}$ ions) and anions were actually given in the form of $CuCl_2$ and $AgNO_3$, respectively, and that "OL" in the "resistance" column of Table 2 indicates that the resistance value could not be measured because of going beyond a measurable range.

Figure 3:
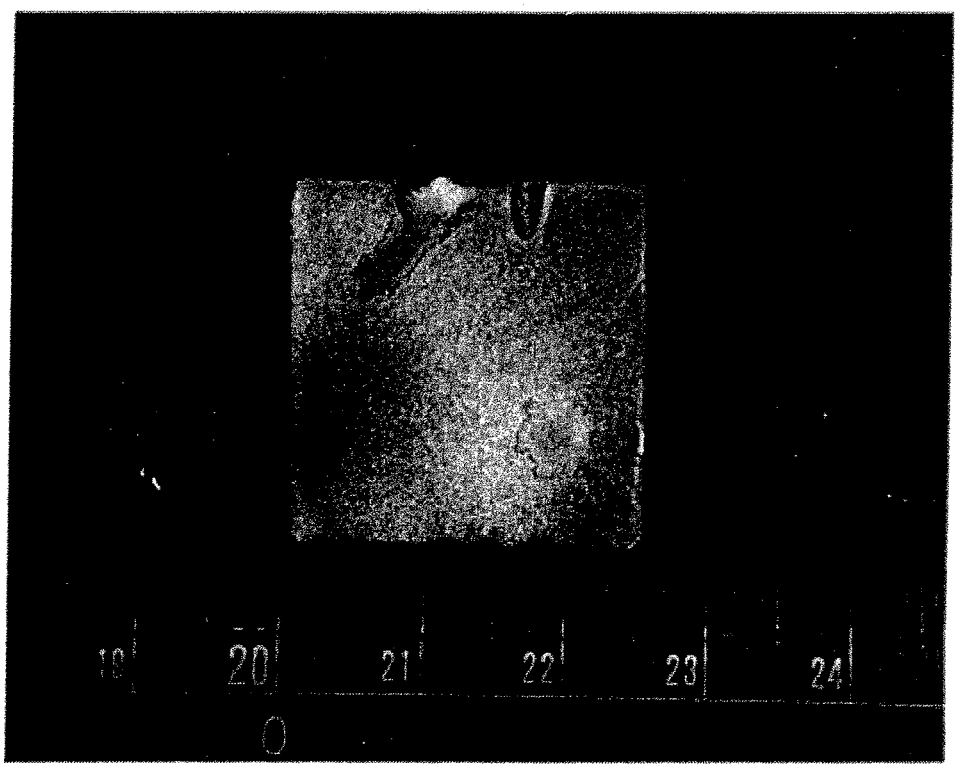
FIG. 3 is a photograph of the outside appearance of the substrate on which the conducting polymer/metal composite is precipitated.
Figure 4:
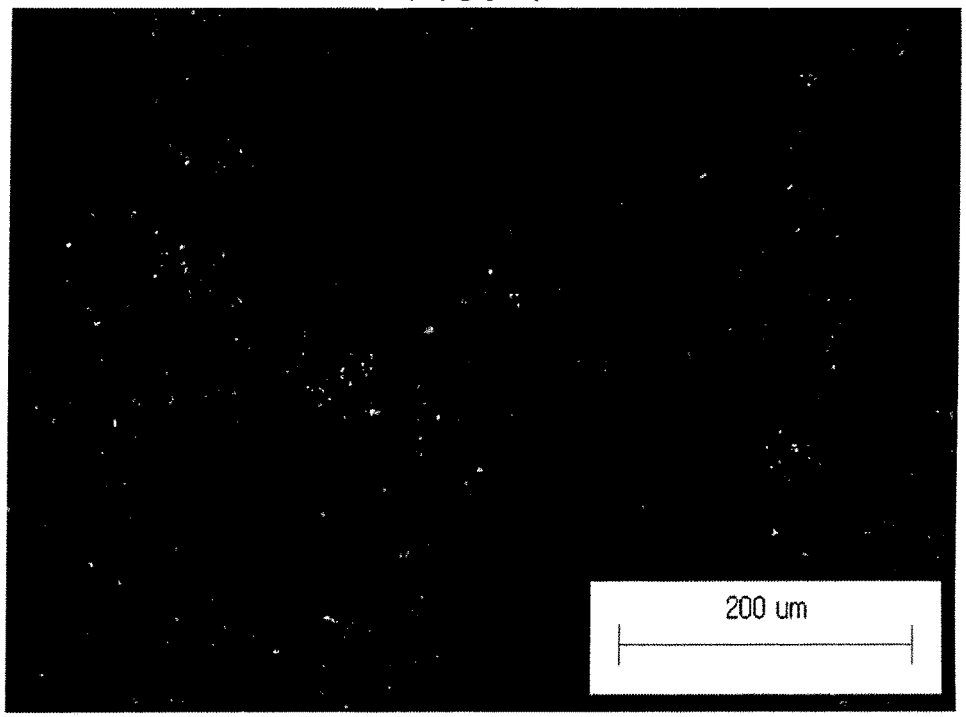
FIG. 4 is a microphotograph of the precipitated conducting polymer/metal composite.

FIG. 3 is a photograph showing the outside appearance of an exemplary substrate having the conducting polymer/metal composite precipitated on it as described above. This exemplary substrate is corresponding to Run No. 3 in Table 2. FIG. 4 is a microphotograph of the thus precipitated conducting polymer/metal composite. As can be seen from FIG. 4, the metal nanoparticles that look like bright spots (in orange color in the original photograph) are dispersed throughout the conducting polymer looking in black. As far as FIGS. 3 and 4 are concerned, the conducting polymer/metal composite remains precipitated with none of small and large pores.

Example 2

For comparisons of the present invention with Non-Patent Publication 4, experimentation was carried out. Experimental conditions and measurement conditions are given below.

Pyrrole concentration: 0.1 mol/L

Metal ion concentration: 0.1 mol/L

Anion: $NO_3^-$

Anion concentration: 0.1 mol/L

Solvent: acetonitrile

Substrate: glass

Reaction time: 60 min.

As a result, when pyrrole was used as the monomer and $Ag^+$ was used as the metal ion, the precipitates obtained by carrying out precipitation for 4 hours according to the process of Non-Patent Publication 4 were found to have resistance values of as high as $10^5$ to $10^7 \Omega$. When $Cu^{2+}$ was used in place of $Ag^+$, there was no precipitation of any conducting polymer/metal composite found at all.

When the combination of pyrrole and $Ag^+$ was treated according to the invention, however, conducting polymer/metal composites having resistance values of 0.3 to $0.6 \times 10^{-1} \Omega$ were obtained by less than 20 minutes precipitation under ultraviolet irradiation. When $Cu^{2+}$ was used in place of $Ag^+$, resistance values of 0.2 to $0.3 \times 10^2 \Omega$ were obtained by ultraviolet irradiation in a precipitation time of less than 10 minutes.

From the results of comparative experimentation, it is found that the single conducting polypyrrole (doped with PTS anions) had a resistance of $0.2 \times 10^2 \Omega$.

Based on the results, etc. of experimentation set out in Table 2, the monomer and metal concentrations preferable to use pyrrole as the monomer and $Ag^+$ or $Cu^{2+}$ as the metal ion were found. The results are set out in Table 3 together with the resistivity of one conventional conducting polymer, Cu formed by electroless plating, and W formed by CVD that are given for comparison.

Another feature of the invention is that the growth rate of the conducting polymer/metal composite is larger than that of another conventional conductor. To show this, the growth rate (i.e., the film growth rate in the thickness direction) is further tabulated in Table 3.

TABLE 3

Inventive Examples (Rundown)

| Monomer | Cation | |
| --- | --- | --- |
| Pyrrole 0.1 mol/L or more | $Ag^+$ mol/L 5 times to up to 20 times as much as the monomer | $Cu^{2+}$ mol/L |
| Pyrrole 0.05 mol/L or more | | equal to, or up to 10 times as much as, the monomer |

| Resistivity Ωcm | Film-Formation Rate nm/s |
| --- | --- |
| 0.00018 | 42 |
| 1.8 | 67 |

Comparative Examples (Rundown)

| | Resistivity Ωcm | Film-Formation Rate nm/s |
| --- | --- | --- |
| Polypyrrole (doped with PTS) | 0.36 | 11 (1*) |
| Cu-plating | 1.67E−06 | 0.5~1 (2*) |
| W-CVD | 5.3E−06 | 1~8 (3*) |

(1*): Measured values (for resistivity, the resistance measured by the same method as in the examples was converted into resistivity)
(2*): Data from Non-Patent Publication 2
(3*): Data from Patent Publication 1 and Non-Patent Publication 3

The resistivity of the conducting polymer/metal composite varies depending on the pyrrole and metal ion concentrations. What is tabulated in Table 3 is the best of the examples within the corresponding pyrrole and metal ion concentration ranges. It is noted that the anions useable herein may be not $NO_3^-$ and $Cl^-$ used in the aforesaid examples alone but $I^-$, $BF_4^-$, etc. In addition, many other anions may be used, including protonic acid ions (such as $SO_4^{2-}$ and $ClO_4^-$ other than $NO_3^-$); halide ions (such as $F^-$ and $Br^-$, or a mixture of them, other than the aforesaid $Cl^-$ and $I^-$), Lewis acid ions (such as $PF_6^-$ and $AsF_6^-$ other than the aforesaid $BF_4^-$); halide anions of transition metals (anions where $FeCl_3$ or $MoCl_5$ may probably take the form of $FeCl_4^-$ or $MoCl_6^-$); and organic compound anions such as ones (in which substituents of organic compounds such as PSS other than PTS take the form of anions such as $SO_3^-$, TCNQ, TCNE, and DDQ).

As can be appreciated from Table 3, the metal conductors comprising Cu or W formed as in conventional ways have a very low resistivity. However, they are quite insufficient for the formation of practical TSVs because of their very slow growth.

Single conducting polypyrrole has a resistivity much higher than that of a conducting polymer/metal composite using Ag as the metal. However, it is not practical for the formation of TSVs, because the resistivity is ⅕ of that of the composite using Cu, but the growth rate is as low as ⅕ too.

To the contrary, the conducting polymer/metal composite obtained in the invention has a resistivity enough to stand up to practical use, and a growth rate much higher than that of this type of conventional conducting material so that it can be used for the formation of TSVs and other conductors at practical rates.

As can also be noted from Table 3, the resistivity (0.36 Ωm) of the single conducting polypyrrole is smaller than 1.8 Ωm of the inventive conducting polymer/metal composite using copper as the metal for the following reason.

The resistivity of polypyrrole varies depending on the type and concentration of the dopant anion. In the present disclosure, the PTS dopant is used for comparison because it reportedly makes sure the lowest resistivity.

On the other hand, the conductivity (resistivity) of the conducting polymer/metal composite according to the invention is considered to be determined by the conductivity of polypyrrole itself and the content of the metal. In the polypyrrole/copper composite exemplified herein, polypyrrole is supposed to have been doped with chloride ions. Chloride ions do not contribute as much to conductivity as PTS anions, and the amount of doping is considered to have been small in this example. Further, the content (amount of precipitation) of copper is small in the aforesaid example using copper for the metal, and this is also considered as one of the reasons that the conductivity of the composite was lower than that of polypyrrole (doped with PTS). In any case, it is found that according to the examples here, the aforesaid good conductivity and growth rate have already been achieved well before the sufficient optimization of the raw material, the precipitation conditions, etc.

Figure 5:
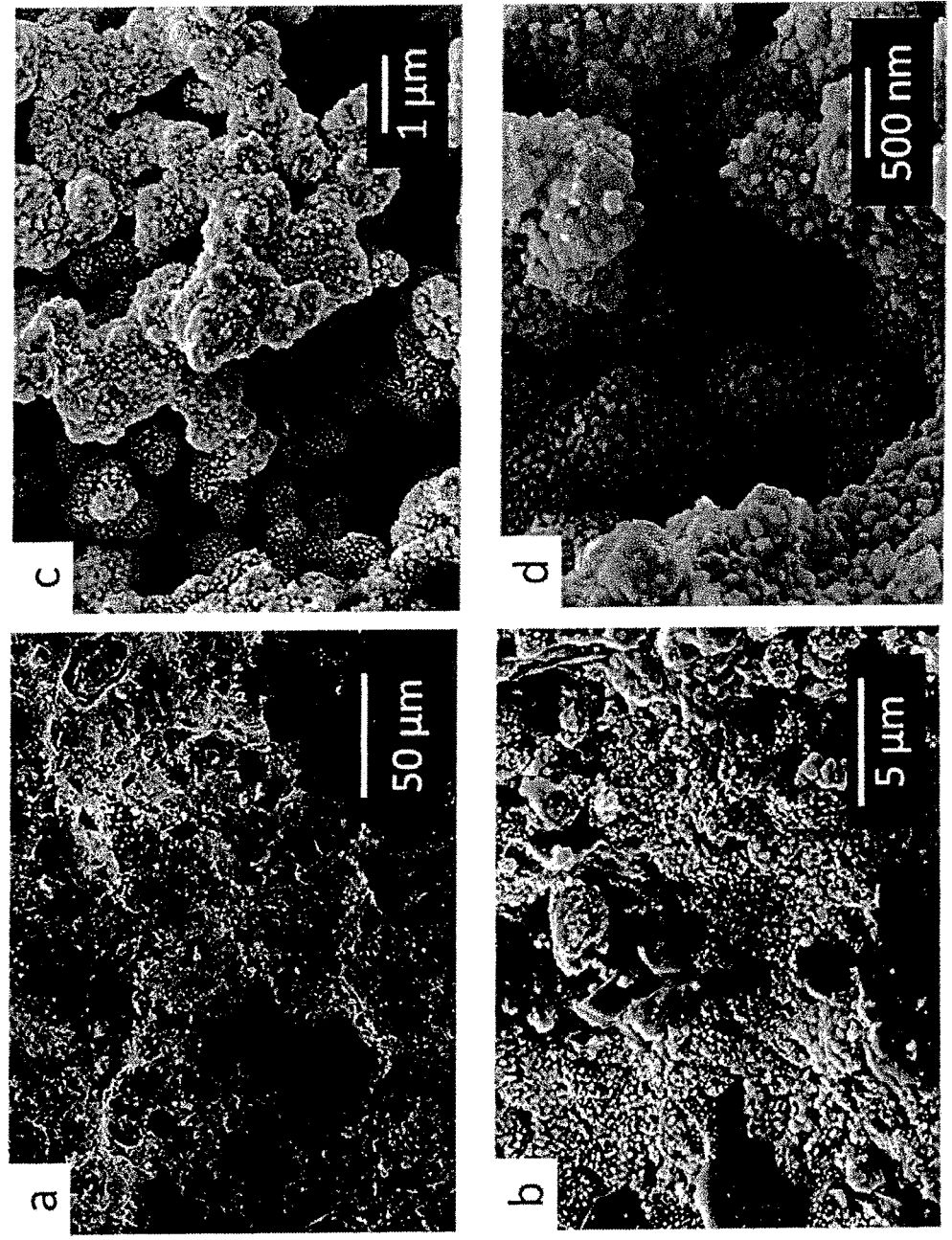
FIG. 5 is an SEM image of the precipitated conducting polymer/metal composite at four magnifications.
Figure 7:
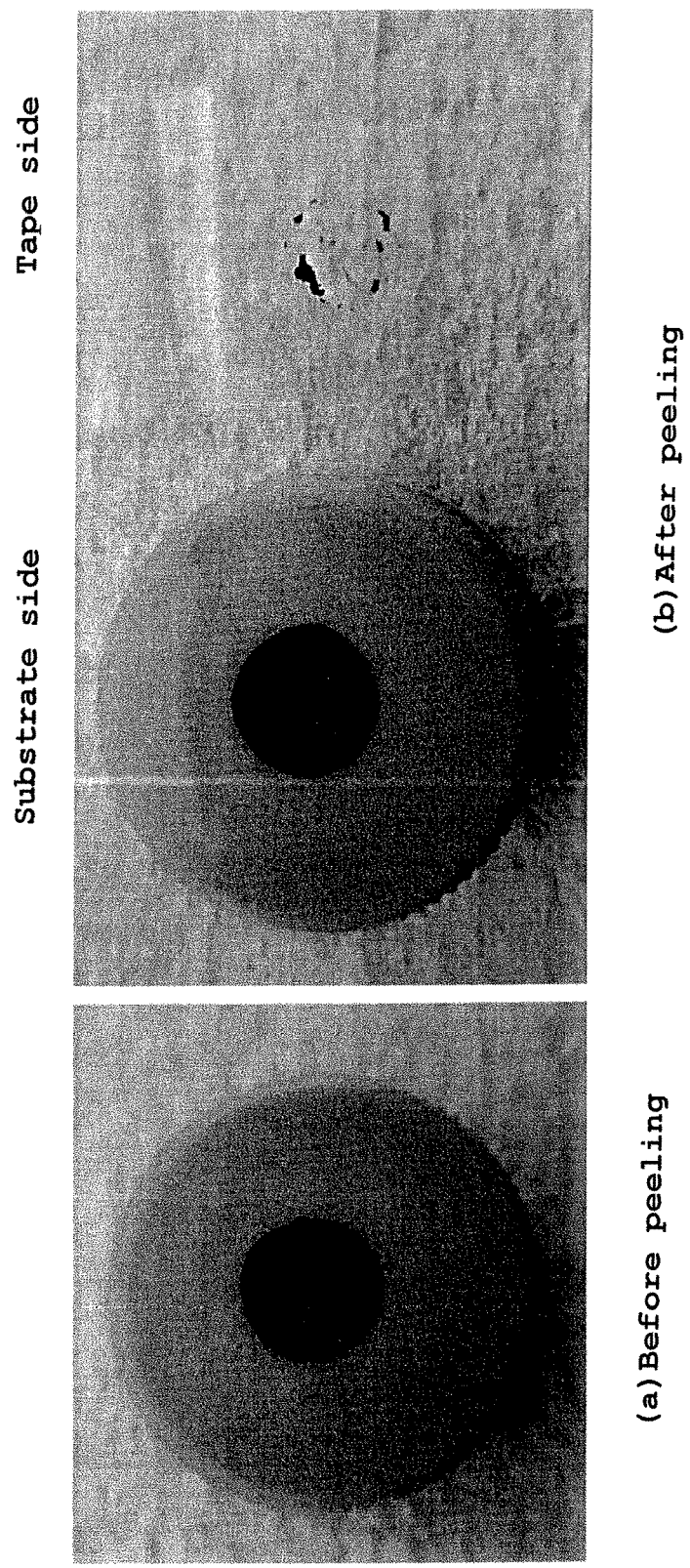
FIG. 7 is a photograph indicative of the results of tape peel testing on a polypropylene substrate with the conducting polymer/metal composite precipitated on it.
Figure 8:
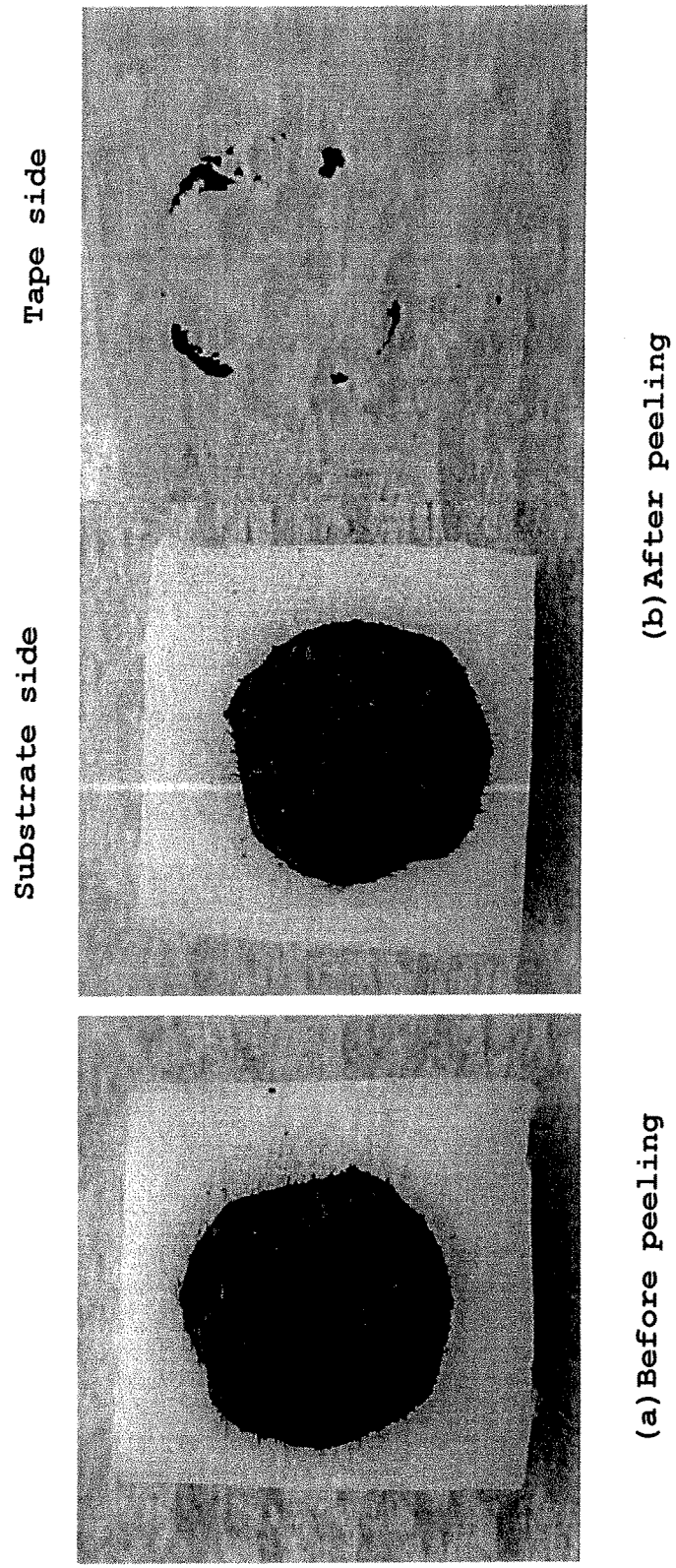
FIG. 8 is a photograph indicative of the results of tape peel testing on a Teflon substrate with the conducting polymer/metal composite precipitated on it.
Figure 9:
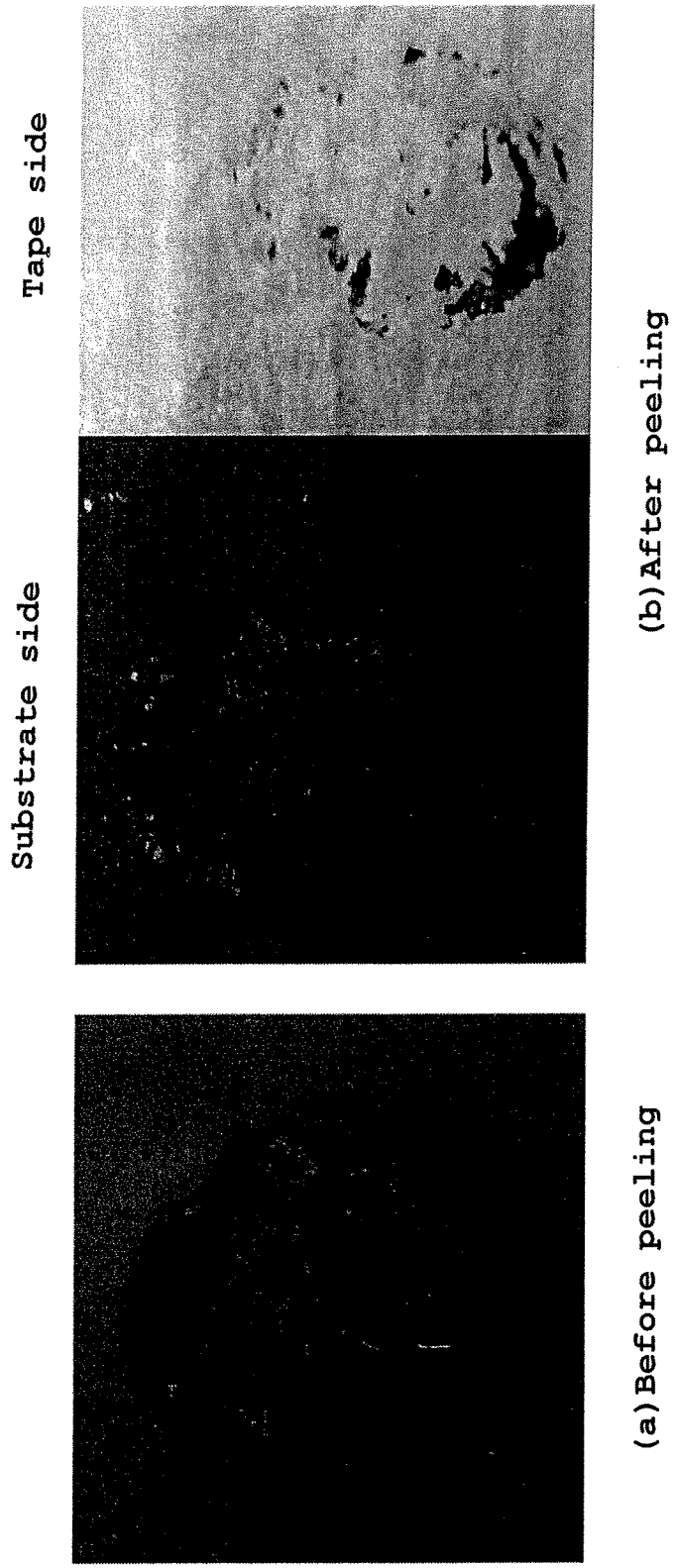
FIG. 9 is a photograph indicative of the results of tape peel testing on a polyvinyl chloride substrate with the conducting polymer/metal composite precipitated on it.
Figure 10:
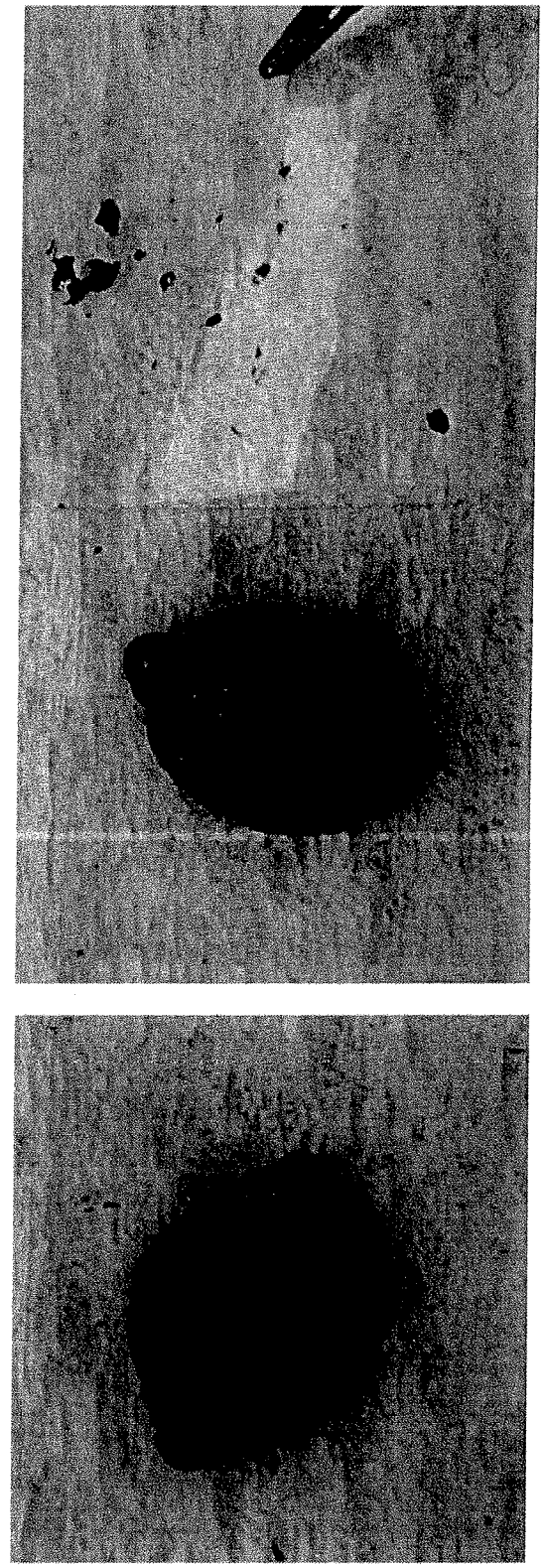
FIG. 10 is a photograph indicative of the results of tape peel testing on an olefin resin substrate with the conducting polymer/metal composite precipitated on it.
Figure 12:
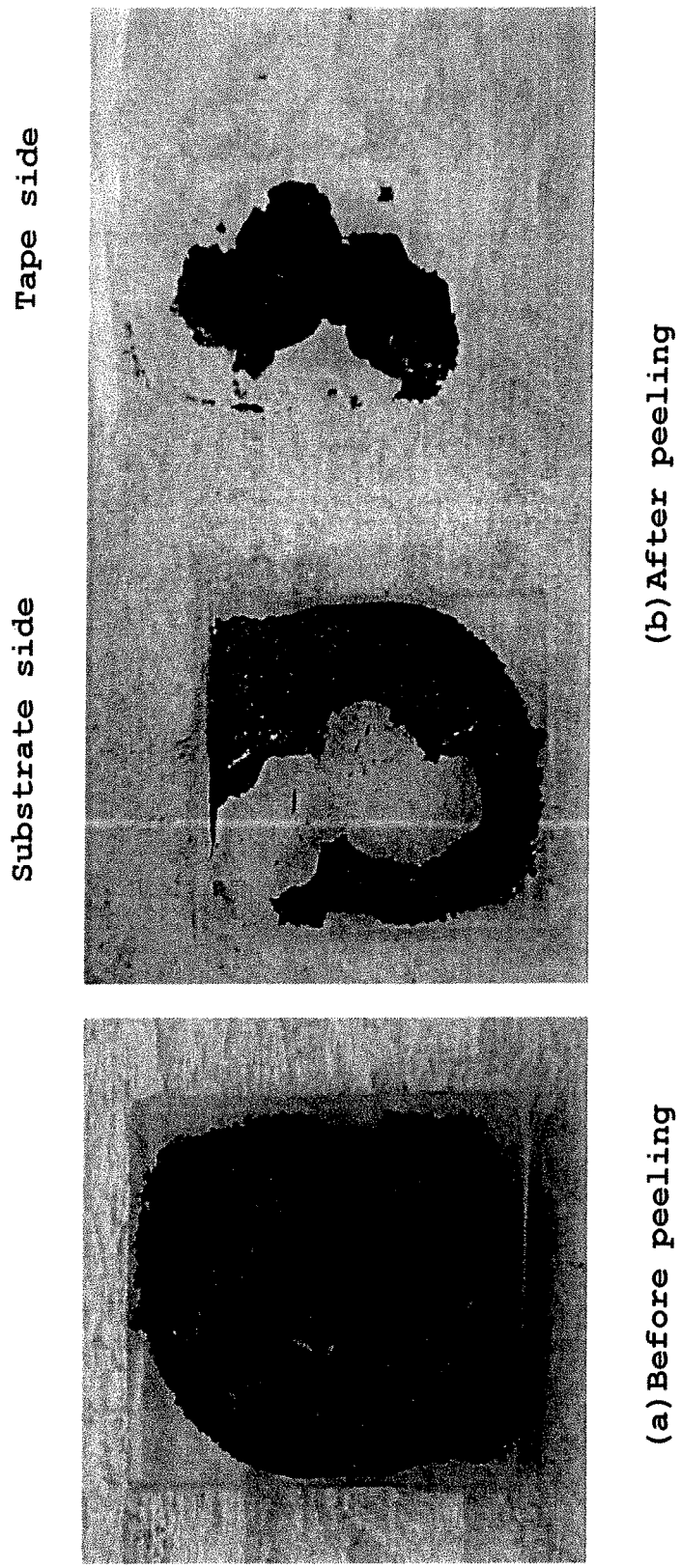
FIG. 12 is a photograph indicative of the results of tape peel testing on a polyethylene substrate with the conducting polymer/metal composite precipitated on it.
Figure 13:
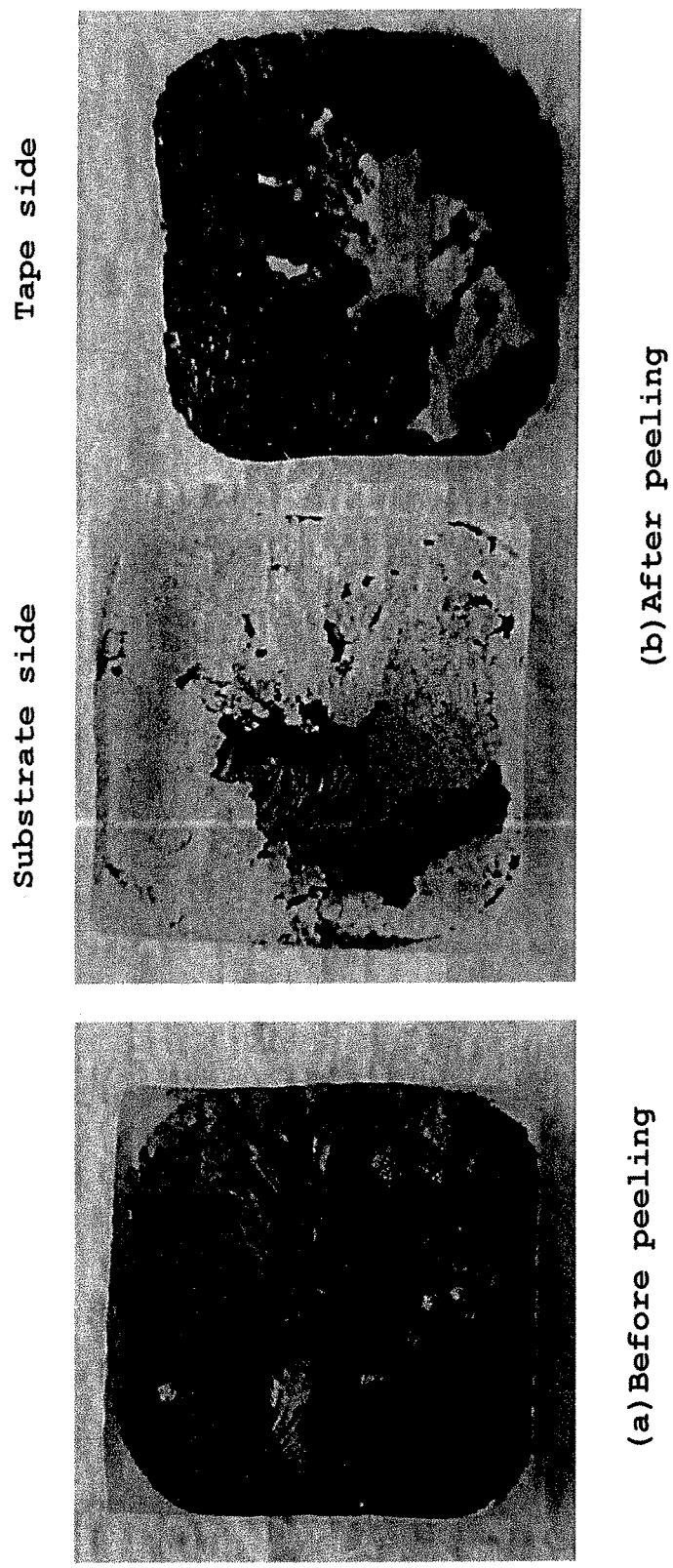
FIG. 13 is a photograph indicative of the results of tape peel testing on an acrylic resin substrate with the conducting polymer/metal composite precipitated on it.
Figure 16:
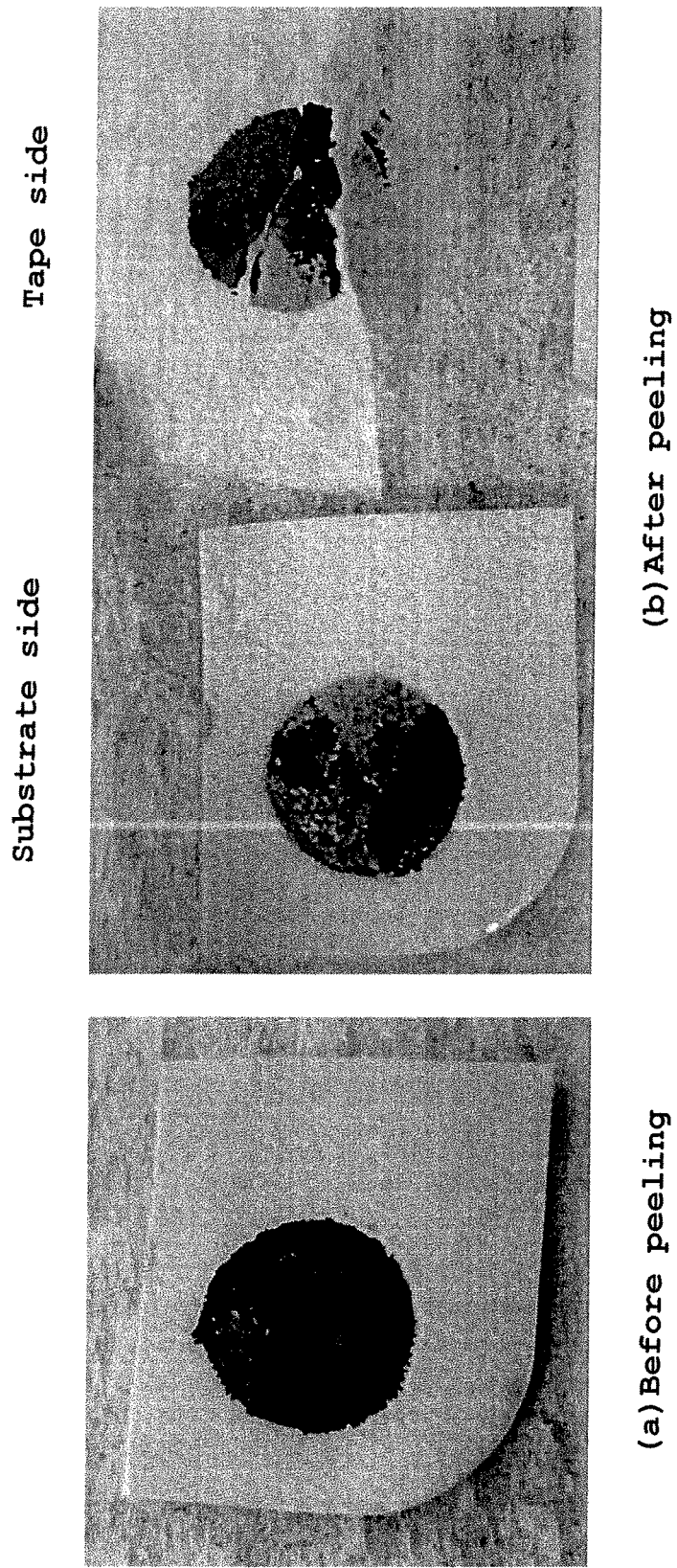
FIG. 16 is a photograph indicative of the results of tape peel testing on a glossy paper substrate with the conducting polymer/metal composite precipitated on it.
Figure 17:
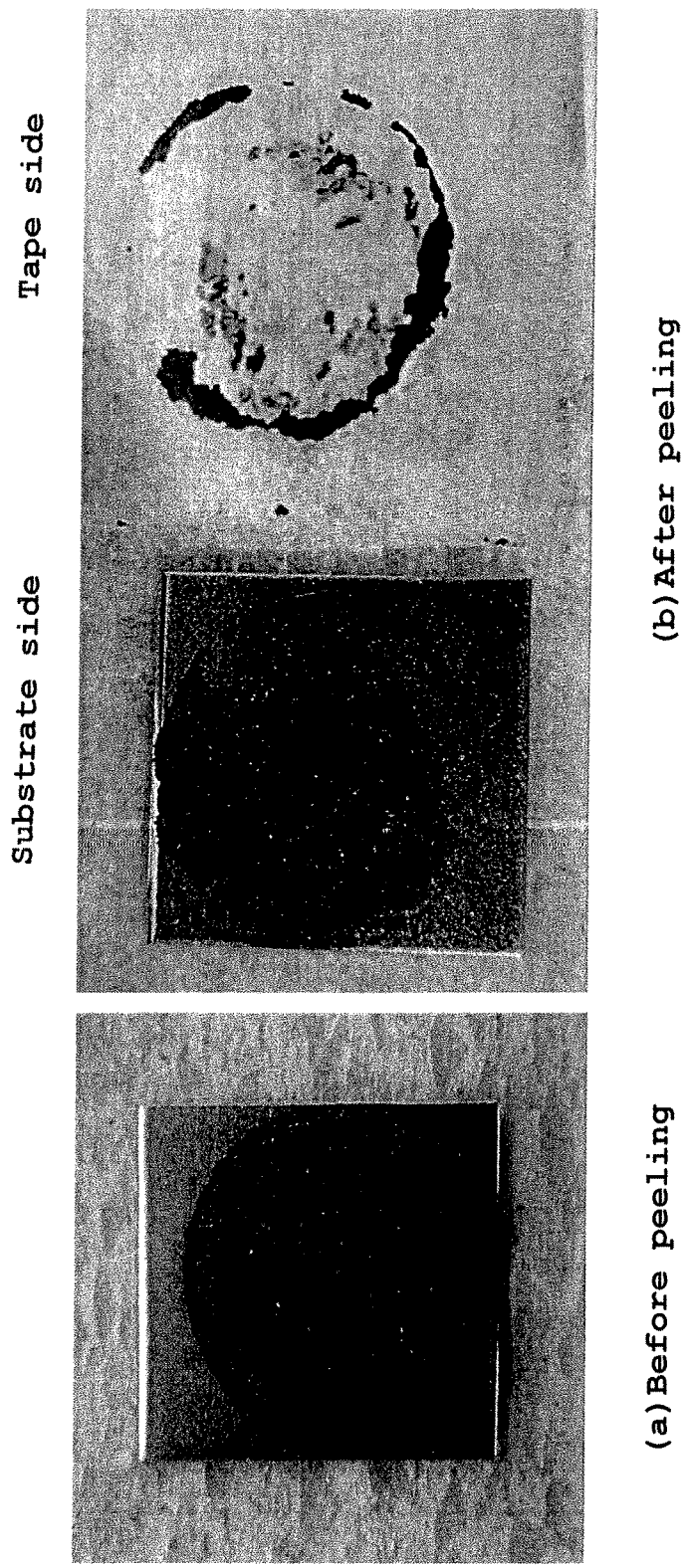
FIG. 17 is a photograph indicative of the results of tape peel testing on a metallic titanium substrate with the conducting polymer/metal composite precipitated on it.
Figure 18:
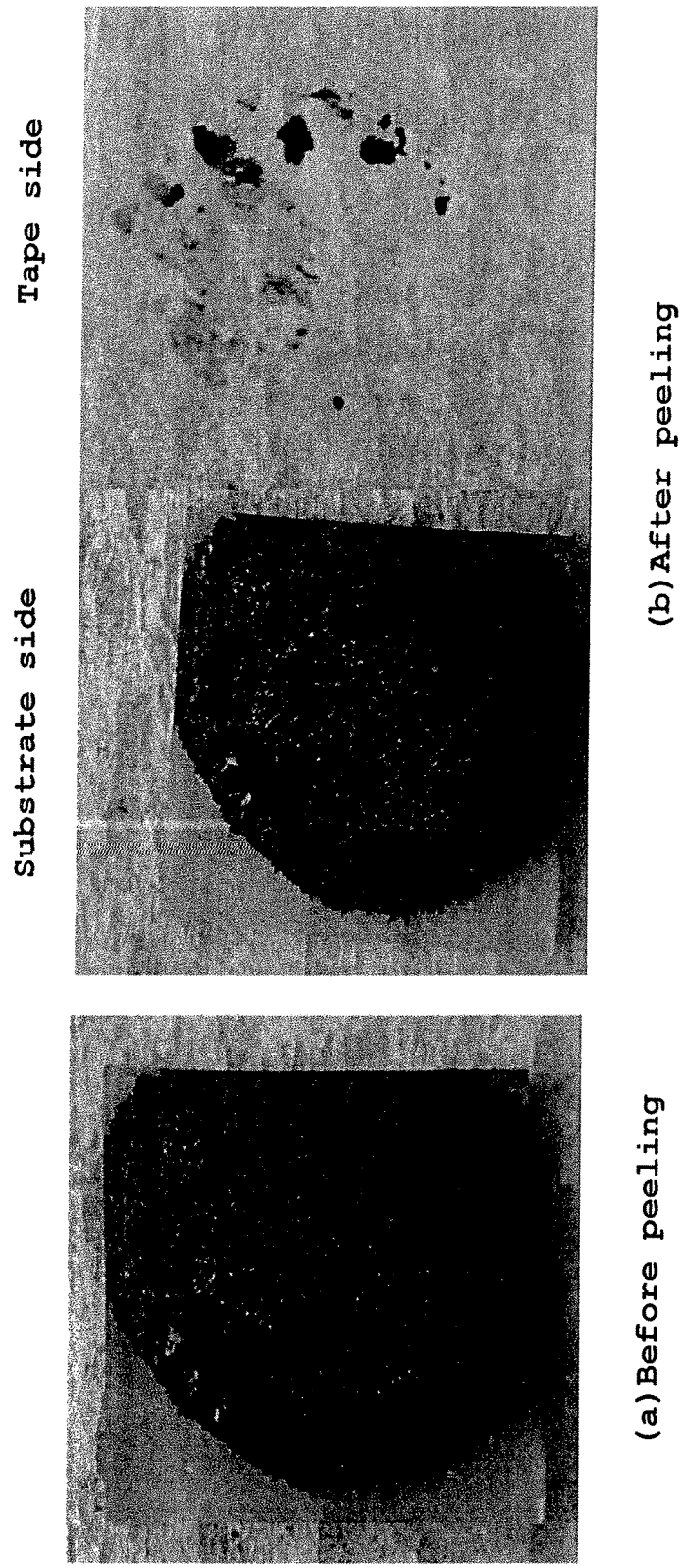
FIG. 18 is a photograph indicative of the results of tape peel testing on a glass substrate (having a blasted surface) with the conducting polymer/metal composite precipitated on it.

Further to clarify the nanolevel structure of the conducting polymer/metal composite according to the invention, SEM images of the surface of the precipitated conducting polymer/metal composite were examined. By way of example but not by way of limitation, given in FIG. 5 are SEM images at four different magnifications of the surface of the conducting polymer/metal composite precipitated under the conditions for Run No. 3 in Table 2, i.e., out of an acetonitrile solution in which polypyrrole was dissolved as the monomer at a concentration of 0.2 mol/L and $Ag^+$ in the form of silver nitrate was dissolved as the metal ion at a concentration of 1 mol/L. Note here that the light irradiation time for precipitation was 120 minutes. In a low-magnification SEM image of FIG. 5(a), particles of 5 to 20 μm in diameter are observed on the surface of the precipitate. In a higher-magnification SEM image of FIG. 5(b), some granular particles are observed, and they are each composed of submicron-size smaller particles. A large portion of the surface of each granular particle is covered with even smaller particles. In an even higher-magnification SEM image of FIG. 5(c), the aforesaid even smaller particles look like a granular aggregate having high brightness, and lie on interconnected cylindrical materials looking dark and having a thickness of 0.1 to 1 μm. In the highest-magnification SEM image of FIG. 5(d), the size is of the order of 10 to 200 nm. The aforesaid even smaller, high-brightness particles are observed on the dark cylindrical materials. The high-brightness particles and the dark cylindrical materials are considered to be metallic silver and polymer, respectively.

These observations under the microscope are suggestive of the growth mechanism of the conducting polymer/metal composite according to the invention. The polymer tends to grow in a one-dimensional direction whereas the metal (silver in the specific experimentation exemplified herein) is precipitated on the surface of the polymer, growing in three-dimensional directions. In other words, the metal nanoparticles are not buried in the polymer to cover the polymer; they tend to be localized on the surface of the polymer bulk or lump in such a way as to provide a covering over that surface, although a part of them may possibly be confined in the polymer (for example, see FIGS. 5(c) and 5(d)). The result is that in the conducting polymer/metal composite of the invention, at least a part of an element having higher conductivity among elements forming the composite comes together on the surface of the composite while it is externally exposed (i.e., not covered by the polymer), making the conductivity of the whole composite higher. Further, due to the tendency of the polymer to grow in a one-dimensional direction, a structure having a high aspect ratio such as a rod- or string-like structure (herein called the filament) appears on the surface, making the surface area larger even with the same volume. In this example, that filament has an aspect ratio of about 2 to 10. Such a structure allows for an increase in high-conductivity paths through which currents flow more readily, making the conductivity of the composite much higher.

Example 3

Set out below is an exemplary behavior of the reaction system using both light and heat as the energy given for precipitation of the conducting polymer/metal composite.

Silica glass (8×8×0.9 mm) used for the substrate was immersed in an acetonitrile solution containing silver nitrate (1.0 mol·dm$^{-3}$) providing a source for metal cations and doping anions, and pyrrole (0.5 mol·dm$^{-3}$) as the organic monomer. An ultra-high-pressure mercury lamp (emission line wavelengths: 436 nm, 405 nm, and 365 nm) was used for irradiation of the reaction system with light at an intensity set at 30 mW·cm$^{-2}$ or 60 mW·cm$^{-2}$. The reaction system was heated by a hot plate at a temperature set at 50° C. or 70° C. In the absence of heating, the reaction system was at a temperature of 30° C.

When the heating temperature was varied in the absence of light irradiation, the solution remained transparent at 30° C. or 50° C. irrespective of the lapse of time. When the reaction system was heated at 70° C. in the absence of light irradiation, there was a black precipitate obtained that increased in the yield with the lapse of time. This matches well the report (Non-Patent Publication 5) to the effect that an aggregate of silver particles, each covered with black polypyrrole, is formed.

When the intensity of light irradiation was varied in an unheated state (30° C.), on the other hand, the solution remained transparent in the absence of light irradiation irrespective of the lapse of time. At a light irradiation intensity of 30 mW·cm$^{-2}$, the solution turned yellow with the lapse of time, undergoing no change 30 minutes after the reaction. At a light irradiation intensity of 60 mW·cm$^{-2}$, the solution turned more yellowish within a shorter time, and after the lapse of 10 minutes, there was a precipitate observed in a mixed black/silver color and the yield increased until after the lapse of 60 minutes, after which there was no change observed.

When both the light irradiation intensity and the heating temperature were varied, there was a precipitate observed in a mixed black/silver color, and by increasing the light irradiation intensity and/or the heating temperature, the tendency of the yield to grow large was observed. A precipitate obtained under light irradiation had a structure wherein the surface of the conducting polymer was covered with fine particles of metallic silver, and from this it is considered that the silver precipitate comprises an aggregate of such fine particles.

From the aforesaid behavior of the reaction system, it has emerged that in the reaction of forming the composite of conducting polypyrrole, metallic silver and metal, the structure wherein the surface of polypyrrole is covered with silver is readily developable by light irradiation. It has also emerged that heating under light irradiation makes a main contribution to an increase in the precipitation reaction rate.

While both light and heat were used as the energy provided for precipitation of the conducting polymer/metal composite in the aforesaid example, it is to be understood that both light and sound may also be used in combination. Although every sound may generally be used, it is preferable to use ultrasonic waves having a frequency of 20 kHz or higher. To this end, ultrasonic waves used with ultrasonic scrubbers, etc., for instance, those having a frequency of about 20 kHz to about 100 kHz may be used. By irradiation with sound such as ultrasonic waves, it is possible to control the length and aspect ratio of the polymer forming the ensuing particles, and the diameter of metal particles. This makes use of a phenomenon often experienced with application of ultrasonic waves to dispersion of emulsions or dissolution of powders in liquids, whereby the size of particles may be reduced.

Example 4

To examine adhesion between the inventive conducting polymer/metal composite and the associated substrate, tape peel testing was carried out under the following conditions.

To make samples thinner, a composite dispersed in a solution (probably the particle size was smaller as conventional) was prepared beforehand, and that solution was added dropwise onto various substrates to be subjected to tape peel testing, and dried.

Set out below are more specific experimental conditions.
Preparatory Solution
Pyrrole concentration: 0.2 mol/L
Metal (Ag) ion concentration: 1.0 mol/L
Anion: $NO_3^-$ in an anion concentration of 1.0 mol/L
Solvent: acetonitrile (pyrrole dissolved in 10 ml of acetonitrile)
Polymerization The aforesaid solution was placed in a cell having the following structure (small and thin vessel) where it was polymerized by light having an emission line wavelength of 436 nm, 405 nm or 365 nm and an intensity of 60 mW/cm$^2$ for 10 minutes at room temperature.
Cell structure: A Si sheet cut down to a thickness of 1 mm was sandwiched between optical glasses of 1 mm in thickness.
Deposition of the Composite onto the Substrate Under Test The solution having the post-polymerization composite dispersed in it was let fall down onto the substrate under test by means of a micropipette. The amount of droplets was fixed at 50 μL. After the solution let fall, the substrate was air-dried in a draft. The air-drying of the substrate was performed, not in pitch black, under illumination conditions (fluorescent lamp) for ordinary indoor work. During the drying, the amount of illumination light irradiation was 1 mW or less as measured with an accumulative light-quantity meter.
Tape Peel Testing Tape peel testing is one of the peeling test methods according to the plating adhesion test procedure (JIS-H8504). This test method is provided to apply an adhesive tape to a plating surface and then peel off this tape rapidly and strongly thereby examining the adhesion of the plating. The tape peel testing is generally suitable for relatively thin plating such as noble metal plating, and does not lend itself to thick plating. Where there is good adhesion achievable, however, it may be used for non-destructive, checkup inspection of finished articles. This is the reason such tape peel testing was used for examination of adhesion between the inventive conducting polymer/metal composite and the associated substrate.

The results of the testing carried out as described above are set out in Table 4 and shown in FIGS. 6 to 19.

TABLE 4

| Substrate | Results | Remarks |
|---|---|---|
| ABS resin | ○ | |
| Polypropylene (PP) | ○ | |
| Teflon (PTFE) | ○ | |
| Polyvinyl chloride (PVC) | ○ | |
| Olefin resin | ○ | |
| Polycarbonate (PC) | Δ | |
| Polyethylene | X | |
| Acrylic resin | X | Dissolution of the surface of the substrate |
| Silicone rubber | ○ | |
| Normal paper | Δ | |
| Glossy paper | X | |
| Metallic titanium | Δ | |
| Glass (blasted on the surface) | ○ | |
| Glass (untreated on the surface) | X | |

As can be appreciated from Table 4, FIGS. 6-10, FIG. 14 and FIG. 18, where the ABS resin, polypropylene, Teflon (registered trademark), polyvinyl chloride, olefin resin, silicone rubber, and glass (blasted on the surface) was used as the substrate, there was good adhesion (○) found between the inventive conducting polymer/metal composite and the substrate.

Figure 19:
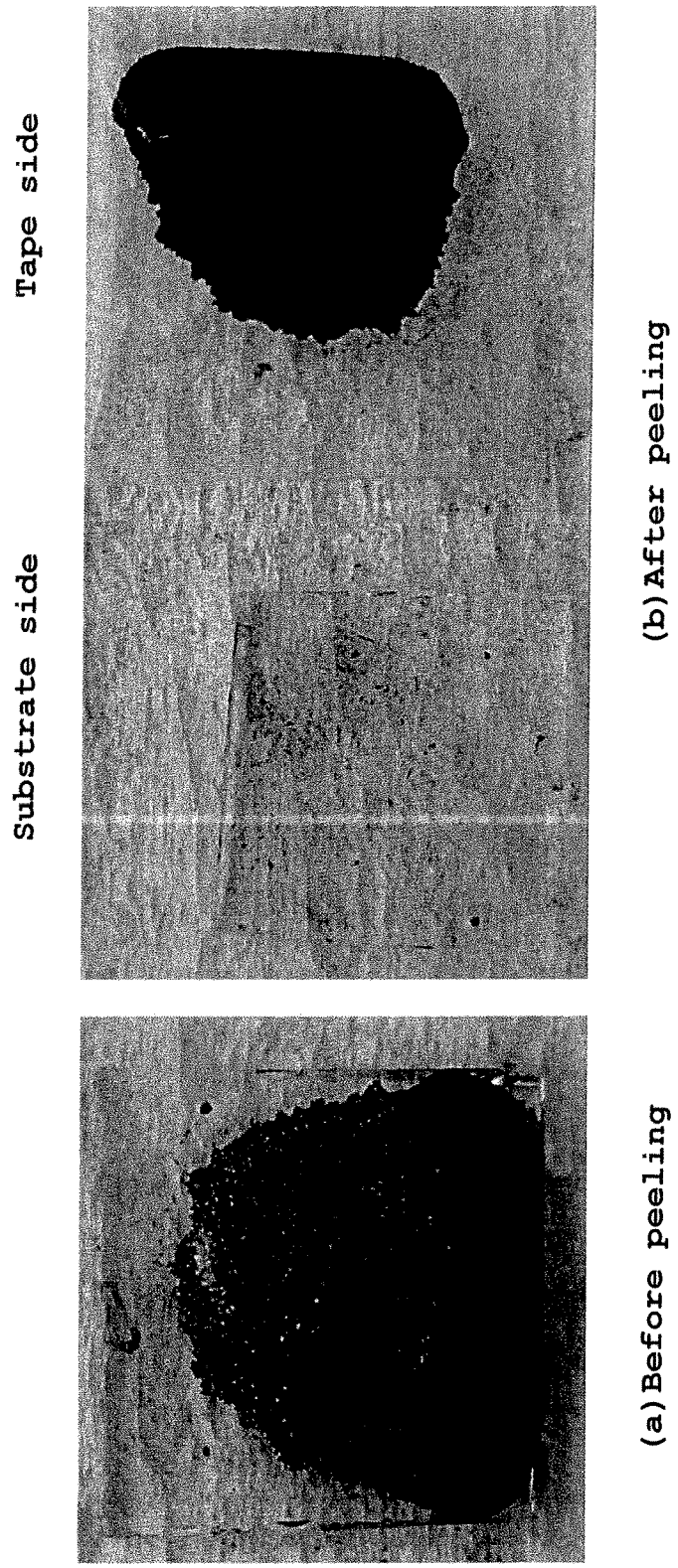
FIG. 19 is a photograph indicative of the results of tape peel testing on a glass substrate (having an untreated surface) with the conducting polymer/metal composite precipitated on it.

Some substrates were found to be insufficient (x) or poor (Δ) in terms of adhesion (FIGS. 11-13, FIGS. 15-17 and FIG. 19), but it does not always mean that the inventive composites are unsuitable for generally available substrates. As can be understood from the results of the tape peel testing that there is a considerable adhesion difference between the glass substrate untreated on the surface (i.e., very smooth glass: FIG. 19) and the glass (FIG. 18) blasted on the surface (with the surface roughened by jetting of a blasting agent), physical states of the substrate surface (such as surface roughness) greatly affect adhesion. Therefore, even when a substrate did not give any sufficient result in the exemplary tape peel testing, good adhesion might possibly be obtained with another substrate that belongs to the same type depending on the raw material actually used for substrate production or the production process, or differences in the later operations.

In any event, the inventive composites are considered to be of very high practicality because even Teflon having usually very low adhesion can have high adhesion by mere use of the deposition method that is a simplified procedure comprising dropping and drying of a solution underwent polymerization and having a composite dispersed in it.

In the results of the adhesion testing (tape peel testing), what is particularly noteworthy may be high adhesion obtained using Teflon or polypropylene as the substrate. This is because Teflon or polypropylene is generally considered to be of low adhesion to a different material due to its low surface energy. Therefore, studies were made of sectional images that are a measure of or index to the adhesion of Teflon.

Figure 20:
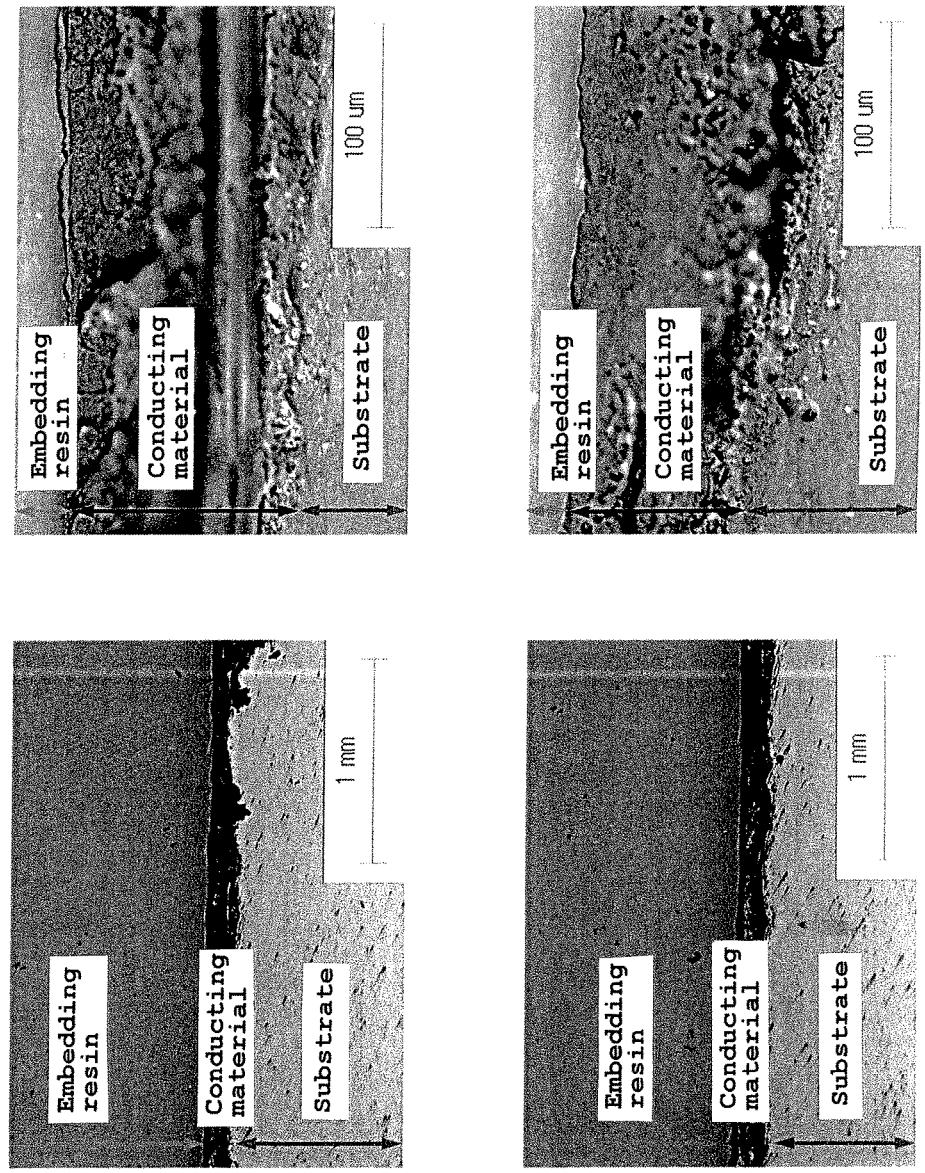
FIG. 20 is a photograph showing a section of a conducting material on a Teflon substrate obtained by an embedding process.

In consideration of the fact that the inventive conducting polymer/metal composite had high adhesion to Teflon known to be of very low adhesion to ordinary materials such as adhesives and various coating materials in adhesion testing, sections of both in close contact with each other were prepared for observation under a microscope. The obtained microphotographs are attached hereto as FIG. 20.

Note here that what is referred to as the "embedding resin" in the photographs is used when a sample is "embedded" in a "resin" such as epoxy, and polished to expose a section under observation to view. Two sets of photographs, low and high magnifications, are provided for the following reason. The material observed here is a novel one for which how to prepare section is not yet established, so a clear-cut smooth surface does not appear over the entire field of view (out of focus over the entire field of view). Therefore, photographs at low and high magnifications were taken of two field-of-view sites, respectively, under as uniform conditions as possible in terms of section preparation and imaging such that they show similar sectional states.

Referring to the section photographs, as far as the interface between the conducting material that is the inventive conducting polymer/metal composite and the Teflon substrate is concerned, and especially as far as the right photograph that is the section photograph on the high magnification side is concerned, it is found that the conducting material remains penetrating down to very narrow irregularities of the substrate, and comes in close contact with the substrate to such an extent that it is almost integrated therewith without being peeled off. The fact that much the same contact state was observed in the sections of both sites would probably show that similar states are obtained in any other sections.

It is a well-known matter that Teflon does not dissolve in ordinary solvents, and it is a matter of course that Teflon is not dissolved by the solvent used for coating and forming the conducting material on the substrate. Nonetheless, it is to be worthy of note that both are in close contact with each other to such an extent that there is any gap found between both found at all.

Example 5

Figure 21:
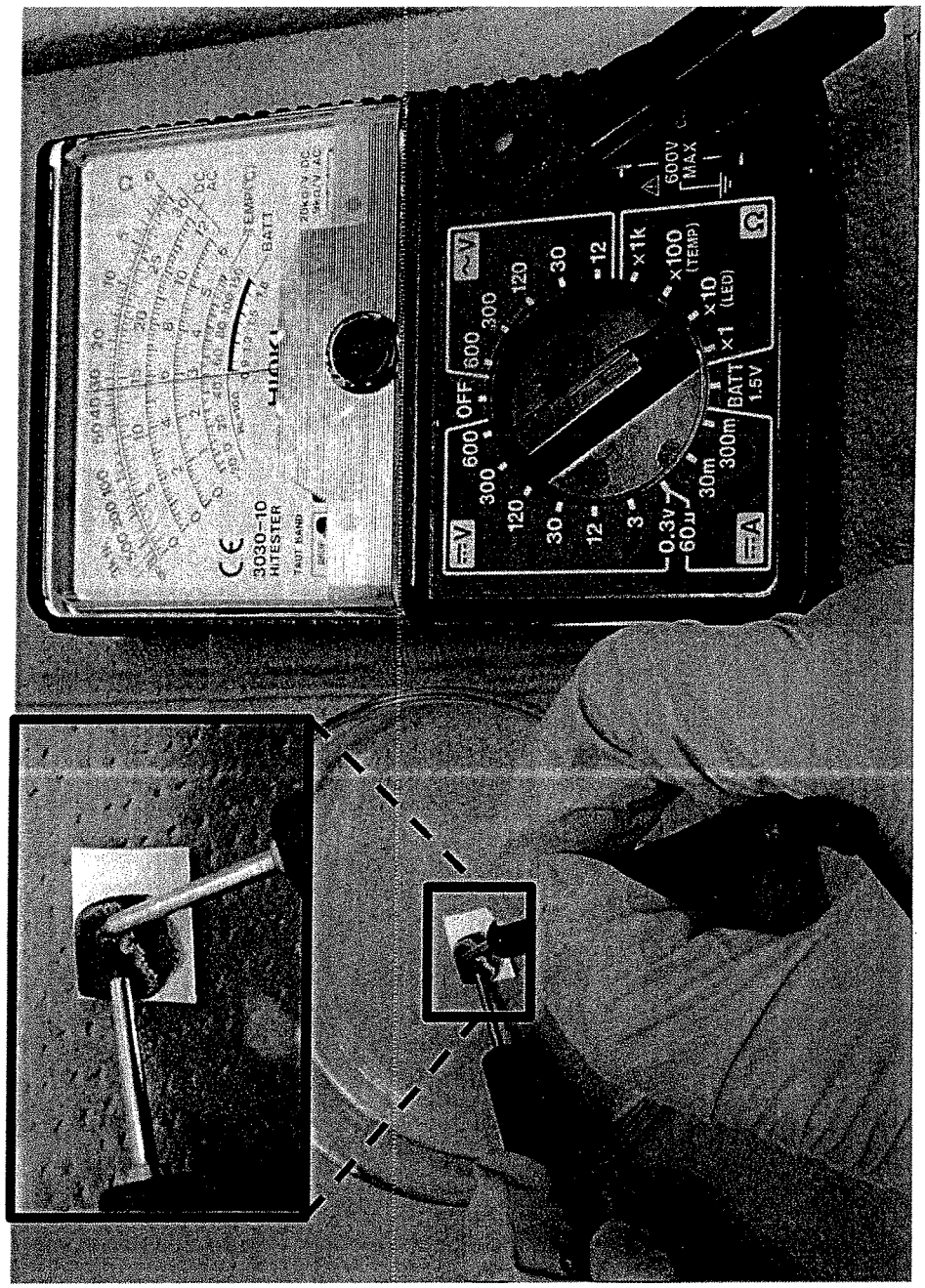
FIG. 21 is a photograph indicative of how to measure the resistance values of a substrate having a conducting polymer/metal composite, and that composite.

The results of bending tests on substrates having the inventive conducting polymer/metal composite on it are shown in FIGS. 21 and 22.

To prove that even when the inventive conducting polymer/metal composite is formed on a flexible material, it follows well the deformation of such a material without peeling off, and keeps on maintaining conductivity upon large deformation, there was an experiment carried out to actually induce large deformation in a paper substrate on which the inventive conducting polymer/metal composite was formed. Note here that the inventive conducting polymer/metal composite formed on the substrate was composed of the same polymer and metal as used in the "tape peel testing".

The first photograph or FIG. 21 is taken of the substrate having the composite prepared as described above. That this composite had a low resistance value was checked up by a tester (the resistance value measured was about 340Ω).

The substrate was largely bent to such a degree that the right and left pieces made an angle of about 90 degree, but failures such as peeling were not observed at all, as can be seen from the second photograph or FIG. 22. The resistance values were measured in this state. Although the resistance values of both cannot be used for direct comparison due to much difficulty in making the force of a probe at a point of measurement and at the time of measurement identical between being not deformed and being deformed (bent), yet the resistance values measured were sufficiently low on the order of 2 kΩ, indicating that there is no loss of conductivity even upon bending.

APPLICABILITY TO THE INDUSTRY

As explained above, the present invention makes it possible to obtain conducting polymer/metal composites of high conductivity suitable for use as conducting fillers for TSVs, flexible electrodes or the like, so they are expected to have some great applications to the industry.

What is claimed is:

1. A conducting polymer/metal composite, comprising:
a filament containing an organic electrically conducting polymer and a metal nanoparticle, and in which at least a part of said metal nanoparticle is exposed on a surface of the organic conducting polymer that is said filament,
wherein said filament has an aspect ratio of 2 to 10,
wherein the organic electrically conducting polymer is based on a compound selected from the group consisting of a straight-chain compound and a heterocyclic compound, all having a conjugate structure, and
wherein the said metal is selected from the group consisting of platinum, palladium, ruthenium, iridium, silver, copper, nickel, iron, chromium, zinc, cadmium, tellurium, tin, lead, and alloys thereof.

2. A conducting polymer/metal composite as recited in claim 1, wherein said filament has a diameter of 1 μm or less.

3. A conducting polymer/metal composite as recited in claim 2, wherein said filament has a diameter of 0.1 μm or more.

4. A conducting polymer/metal composite as recited in claim 1, wherein said metal nanoparticle has a diameter of 10 to 200 nm.

5. A conducting polymer/metal composite as recited in claim 1, wherein the organic electrically conducting polymer is selected from the group consisting of polypyrrole and a polymer of 3,4-ethylenedioxythiophene (EDOT).

6. A conducting polymer/metal composite as recited in claim 1, wherein the filament appears on a surface of the conducting polymer/metal composite.

* * * * *